(12) United States Patent
Osanai et al.

(10) Patent No.: US 9,713,253 B2
(45) Date of Patent: *Jul. 18, 2017

(54) METAL/CERAMIC BONDING SUBSTRATE AND METHOD FOR PRODUCING SAME

(75) Inventors: Hideyo Osanai, Nagano (JP); Takayuki Takahashi, Nagano (JP); Satoru Ideguchi, Nagano (JP); Hirotaka Kotani, Nagano (JP)

(73) Assignee: DOWA METALTECH CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/006,546

(22) PCT Filed: Mar. 29, 2011

(86) PCT No.: PCT/JP2011/058488
§ 371 (c)(1),
(2), (4) Date: Nov. 5, 2013

(87) PCT Pub. No.: WO2012/127695
PCT Pub. Date: Sep. 27, 2012

(65) Prior Publication Data
US 2014/0057131 A1    Feb. 27, 2014

(30) Foreign Application Priority Data
Mar. 23, 2011 (JP) .................. 2011-063504

(51) Int. Cl.
| | |
|---|---|
| *B21D 39/00* | (2006.01) |
| *H05K 1/05* | (2006.01) |
| *H05K 3/02* | (2006.01) |
| *H01L 23/373* | (2006.01) |
| *H01L 21/48* | (2006.01) |
| *B22D 19/00* | (2006.01) |

(Continued)

(52) U.S. Cl.
CPC ......... *H05K 1/053* (2013.01); *B22D 19/0081* (2013.01); *B22D 19/04* (2013.01);
(Continued)

(58) Field of Classification Search
CPC ............................................ Y10T 428/12486
(Continued)

(56) References Cited

U.S. PATENT DOCUMENTS 3,399,332 A * 8/1968 Savolainen .................... 257/746
3,970,136 A * 7/1976 Cannell et al. ................ 164/108
(Continued)

FOREIGN PATENT DOCUMENTS

| JP | 2001-007465 A | 1/2001 |
|---|---|---|
| JP | 2003-086747 A | 3/2003 |

(Continued)

*Primary Examiner* — Humera Sheikh
*Assistant Examiner* — Seth Dumbris
(74) *Attorney, Agent, or Firm* — Bachman & LaPointe, PC

(57) ABSTRACT

A metal/ceramic bonding substrate includes: a ceramic substrate; a metal plate bonded directly to one side of the ceramic substrate; a metal base plate bonded directly to the other side of the ceramic substrate; and a reinforcing member having a higher strength than that of the metal base plate, the reinforcing member being arranged so as to extend from one of both end faces of the metal base plate to the other end face thereof without interrupting that the metal base plate extends between a bonded surface of the metal base plate to the ceramic substrate and the opposite surface thereof.

10 Claims, 23 Drawing Sheets

(51) Int. Cl.
*B22D 19/04* (2006.01)
*H05K 1/03* (2006.01)
*H05K 3/00* (2006.01)

(52) U.S. Cl.
CPC ........ *H01L 21/481* (2013.01); *H01L 21/4871* (2013.01); *H01L 23/3735* (2013.01); *H05K 3/022* (2013.01); *H01L 2924/0002* (2013.01); *H05K 1/0306* (2013.01); *H05K 3/0061* (2013.01); *H05K 2201/09136* (2013.01); *H05K 2201/2009* (2013.01); *H05K 2203/128* (2013.01); *Y10T 428/12618* (2015.01); *Y10T 428/2457* (2015.01); *Y10T 428/2462* (2015.01); *Y10T 428/24942* (2015.01)

(58) Field of Classification Search
USPC .................................................. 428/614, 627
See application file for complete search history.

(56) References Cited

U.S. PATENT DOCUMENTS

| | | | | |
|---|---|---|---|---|
| 4,888,247 A | * | 12/1989 | Zweben et al. | 428/408 |
| 5,151,777 A | * | 9/1992 | Akin et al. | 257/712 |
| 5,296,310 A | * | 3/1994 | Kibler et al. | 428/614 |
| 6,091,131 A | * | 7/2000 | Cook | H01L 23/5329 257/629 |
| 6,257,310 B1 | * | 7/2001 | Janko | 164/61 |
| 6,441,490 B1 | * | 8/2002 | Ngo | H01L 21/76807 257/42 |
| 6,762,497 B2 | * | 7/2004 | Gayet | H01L 21/76816 257/758 |
| 6,994,917 B2 | * | 2/2006 | Kinoshita | B23K 20/04 228/190 |
| 2002/0185726 A1 | * | 12/2002 | North | H01L 23/3735 257/707 |
| 2005/0093115 A1 | * | 5/2005 | Eytcheson | 257/668 |
| 2005/0217823 A1 | * | 10/2005 | Osanai | 165/80.2 |
| 2006/0269765 A1 | * | 11/2006 | Collier et al. | 428/469 |
| 2007/0017652 A1 | * | 1/2007 | Osanai et al. | 164/461 |
| 2007/0056713 A1 | * | 3/2007 | Chiriac et al. | 165/104.26 |
| 2011/0096507 A1 | * | 4/2011 | Deram | 361/718 |
| 2014/0083671 A1 | * | 3/2014 | Ideguchi et al. | 165/185 |

FOREIGN PATENT DOCUMENTS

| | | | |
|---|---|---|---|
| JP | 2006-066595 A | 3/2006 | |
| JP | 2006066595 | * 3/2006 | H01L 23/12 |

\* cited by examiner

METAL/CERAMIC BONDING SUBSTRATE AND METHOD FOR PRODUCING SAME

TECHNICAL FIELD

The present invention generally relates to a metal/ceramic bonding substrate and a method for producing the same. More specifically, the invention relates to a metal/ceramic bonding substrate wherein a metal plate (a metal circuit plate) for mounting electronic parts thereon is formed on one side of a ceramic substrate and wherein a metal base plate for heat radiation is formed on the other side thereof, and a method for producing the same.

BACKGROUND ART

In recent years, power modules are used for controlling heavy-current for electric vehicles, electric railcars and machine tools. In conventional power modules, a metal/ceramic insulating substrate is fixed to one side of a metal plate or compound material called base plate by soldering or the like, and semiconductor chips are fixed to a metal circuit plate of the ceramic insulating substrate by soldering. On the other side (reverse face) of the base plate, a radiating fin or cooling jacket of a metal is mounted via a thermal conduction grease by means of screws or the like.

Such a metal/ceramic bonding substrate is easy to warp after, metal plates (a metal circuit plate and a base plate) are bonded to both sides of a ceramic substrate thereof since the metal plates generally have different thicknesses. In addition, the soldering of semiconductor chips to the metal/ceramic bonding substrate is carried out by heating, so that the metal circuit plate and the base plate are easy to warp due to the difference in coefficient of thermal expansion between the bonded members during soldering. Moreover, heat generated from the semiconductor chips passes through the metal/ceramic insulating substrate, solder and base plate to be radiated to air or cooling water by the radiating fin or cooling jacket. Therefore, if the base plate warps during soldering, when the radiating fin or cooling jacket is mounted on the base plate, the clearance therebetween increases, so that the heat sink characteristic of the base plate extremely deteriorates. In addition, even if a metal/ceramic bonding substrate substantially having no warpage is obtained, the warpage of the substrate increases if thermal shocks are repeatedly applied thereto.

In order to solve such problems, there is proposed a circuit board wherein a circuit plate of aluminum or an aluminum alloy is formed on one side of a multilayer structure having a plurality of aluminum nitride substrates bonded to each other via aluminum plates or aluminum alloy plates and wherein a radiating plate is formed on the other side of the multilayer structure (see, e.g., Japanese Patent Laid-Open No. 2001-7465). This circuit board is produced by bonding the circuit plate of aluminum or the aluminum alloy and the radiating plate, by means of a bonding material (a brazing filler metal), to the multilayer structure which is manufactured by bonding the plurality of aluminum nitride substrates and the aluminum or aluminum alloy plates to each other by means of a bonding material (a brazing filler metal).

There is also proposed an insulating circuit board formed by a laminated structure wherein a circuit plate is bonded to one side of a first ceramic plate, wherein a thermal diffusing plate, a second ceramic plate and a radiating plate are bonded to the other side of the first ceramic plate, wherein the circuit plate, the thermal diffusing plate and the radiating plate are made of copper, an copper alloy, aluminum or an aluminum alloy, and wherein the end portion of the thermal diffusing plate is integrated with the end portion of the radiating plate so that the second ceramic plate is completely covered with the thermal diffusing plate and radiating plate (see, e.g., Japanese Patent Laid-Open No. 2003-86747). This insulating circuit board is produced by setting the first and second ceramic plates in a mold, injecting a molten metal of aluminum or an aluminum alloy in the mold at a high pressure for forming the circuit plate, the thermal diffusing plate and the radiating plate, and then, cooling and solidifying the molten metal.

However, the radiating performance of the circuit board disclosed in Japanese Patent Laid-Open No. 2001-7465 is deteriorated by the aluminum nitride substrate since the thermal conductivity thereof is lower than that of the radiating plate (metal base plate) of copper, aluminum or an alloy thereof although the aluminum nitride substrate has a high thermal conductivity (170 W/mK) as a ceramic substrate. Even if a ceramic substrate having a thermal conductivity equal to or higher than that of the metal base plate can be used, such a ceramic substrate is very expensive, so that it is difficult to industrially mass-produce circuit boards using such very expensive ceramic substrates. In addition, in order to bond the plurality of aluminum nitride substrates and the aluminum or aluminum alloy plates to each other to produce the multilayer structure and in order to bond the circuit plate of aluminum or the aluminum alloy and the radiating plate to the multilayer structure, it is required to apply very high pressures using the bonding material (brazing filler metal), and it is required to carry out a laminating step for producing the multilayer structure, so that the producing costs are high.

Similar to the circuit board disclosed in Japanese Patent Laid-Open No. 2001-7465, the radiating performance of the insulating circuit board disclosed in Japanese Patent Laid-Open No. 2003-86747 is deteriorated by the second ceramic plate since the thermal conductivity of the second ceramic plate covered with the thermal diffusing plate and radiating plate is lower than those of the thermal diffusing plate and radiating plate. In addition, when the insulating circuit board disclosed in Japanese Patent Laid-Open No. 2003-86747 is produced, it is difficult to inject the molten metal of aluminum or the aluminum alloy into the mold at a high pressure while the ceramic plate is held at a predetermined position in the mold. Therefore, there are some cases where it is not possible to bond the ceramic plates at appropriate positions, so that it is difficult to completely cover the second ceramic plate with the thermal diffusing plate and the radiating plate to precisely position the second ceramic plate. For that reason, it is difficult to control the warpage of the insulating circuit board, so that there is the possibility that the reliability thereof may be deteriorated by the variation in warpage thereof.

DISCLOSURE OF THE INVENTION

It is therefore an object of the present invention to eliminate the aforementioned conventional problems and to provide a metal/ceramic bonding substrate which has a high radiating performance and which has a small amount of warpage and a small variation in warpage, and a method for producing the same, the method being capable of producing the metal/ceramic bonding substrate at low costs.

In order to accomplish the aforementioned object, according to one aspect of the present invention, a metal/ceramic bonding substrate comprises: a ceramic substrate; a metal plate bonded directly to one side of the ceramic substrate; a metal base plate bonded directly to the other side of the ceramic substrate; and a reinforcing member having a higher strength than that of the metal base plate, the reinforcing member being arranged so as to extend from one of both end faces of the metal base plate to the other end face thereof without interrupting that the metal base plate extends between a bonded surface of the metal base plate to the ceramic substrate and the opposite surface thereof.

In this metal/ceramic bonding substrate, the both end faces of the metal base plate are preferably both end faces in longitudinal directions or lateral directions of the metal base plate. The metal base plate preferably has a portion extending in directions substantially perpendicular to the bonded surface. The reinforcing member is preferably surrounded by the metal base plate.

In the above-described metal/ceramic bonding substrate, the reinforcing member preferably extends through the interior of the metal base plate. In this case, the reinforcing member is preferably a plate member extending in substantially parallel to the bonded surface. The reinforcing member preferably has a surface which extends in substantially parallel to the bonded surface and which has a portion facing the ceramic substrate, the portion of the surface of the reinforcing member having a smaller area than that of the bonded surface. The reinforcing member may comprise a plurality of plate or rod members which are arranged on a plane extending in substantially parallel to the bonded surface and which are spaced from each other at predetermined intervals to extend in substantially parallel to each other. The reinforcing member may be a lattice-shaped plate member comprising a plurality of longitudinal plate portions, which are arranged on a plane extending in substantially parallel to the bonded surface and which are spaced from each other at predetermined intervals to extend in longitudinal directions of the metal base plate, and a plurality of lateral plate portions which are spaced from each other at predetermined intervals to extend in lateral directions of the metal base plate to connect the longitudinal plate portions to each other. The whole surface of a portion of the reinforcing member extending through the interior of the metal base plate is preferably bonded directly to the metal base plate. The end face of the reinforcing member is preferably exposed to the outside, and the whole surface of the reinforcing member expect for the end face thereof is preferably bonded directly to the metal base plate.

In the above-described metal/ceramic bonding substrate, the reinforcing member is preferably made of a steel or a metal which contains iron and at least one selected from the group consisting of nickel, cobalt, copper and manganese. Alternatively, the reinforcing member is preferably made of at least one ceramic selected from the group consisting of alumina, aluminum nitride, silicon nitride and silicon carbide. The metal base plate is preferably made of aluminum or an aluminum alloy, and the metal plate is preferably made of aluminum or an aluminum alloy. The ceramic substrate is preferably made of at least one ceramic selected from the group consisting of alumina, aluminum nitride, silicon nitride and silicon carbide.

According to another aspect of the present invention, there is provided a method for producing a metal/ceramic bonding substrate wherein a metal plate is bonded to one side of a ceramic substrate and wherein a metal base plate is bonded directly to the other side thereof, the method comprising the steps of: preparing a reinforcing member which has a higher melting point and a higher strength than those of the metal base plate; supporting end portions of the ceramic substrate and end portions of the reinforcing member on a mold so that the ceramic substrate and the reinforcing member are arranged in the mold at a predetermined interval; injecting a molten metal into the mold so that the molten metal contacts the reinforcing member and both faces of the ceramic substrate in the mold; and cooling the mold to solidify the molten metal to form the metal plate, which is bonded directly to one side of the ceramic substrate, and to form the metal base plate, which is bonded directly to the other side of the ceramic substrate, while protruding an end portion of the reinforcing member from the metal base plate.

In this method for producing a metal/ceramic bonding substrate, the whole surface of the reinforcing member except for the end portion of the reinforcing member protruding from the metal base plate is preferably bonded directly to the metal base member by injecting the molten metal so that the molten metal contacts the whole surface of the reinforcing member except for the end portion when the molten metal is injected into the mold. The end portion of the reinforcing member protruding from the metal base plate is preferably removed. The mold preferably comprises an upper mold member and a lower mold member, and the end portion of the reinforcing member is preferably clamped by the upper mold member and the lower mold member to be supported on the mold. The reinforcing member is preferably made of a steel or a metal which contains iron and at least one selected from the group consisting of nickel, cobalt, copper and manganese. Alternatively, the reinforcing member is preferably made of at least one ceramic selected from the group consisting of alumina, aluminum nitride, silicon nitride and silicon carbide. The metal plate and the metal base plate are preferably made of aluminum or an aluminum alloy.

According to these aspects of the present invention, it is possible to provide a metal/ceramic bonding substrate which has a high radiating performance and which has a small amount of warpage and a small variation in warpage, and a method for producing the same, the method being capable of producing the metal/ceramic bonding substrate at low costs.

According to a further aspect of the present invention, a metal/ceramic bonding substrate comprises: a ceramic substrate; an aluminum member of aluminum or an aluminum alloy, the aluminum member being bonded directly to one side of the ceramic substrate; and a spray-coated member having a metal member, the surface of which is coated with a sprayed coating, the spray-coated member being arranged in the aluminum member.

In this metal/ceramic bonding substrate, the sprayed coating is preferably a coating of at least one ceramic selected from the group consisting of aluminum oxide, aluminum nitride, silicon carbide and silicon nitride. The metal member is preferably made of copper or a copper alloy. An aluminum plate of aluminum or an aluminum alloy is preferably bonded directly to the other side of the ceramic substrate. The aluminum member preferably has a plate shape, or a shape of a plate integrated with a plurality of fins.

According to a still further aspect of the present invention, there is provided a method for producing a metal/ceramic bonding substrate comprising the steps of: spray-coating a surface of a metal member with a ceramic to obtain a spray-coated member wherein the surface of the metal member is coated with a sprayed coating; arranging the spray-coated member and a ceramic substrate in a mold at a predetermined interval; injecting a molten metal of aluminum or an aluminum alloy into the mold so that the molten metal contacts the whole surface of the spray-coated member and one side of the ceramic substrate in the mold; and cooling the mold to solidify the molten metal to form an aluminum member of aluminum or the aluminum alloy, which surrounds the spray-coated member and which is bonded directly to the one side of the ceramic substrate.

In this method for producing a metal/ceramic bonding substrate, the spray coating is preferably the plasma spray coating. The ceramic used in the spray coating is preferably at least one selected from the group consisting of aluminum oxide, aluminum nitride, silicon carbide and silicon nitride. The metal member is preferably made of copper or a copper alloy. An aluminum plate of aluminum or an aluminum alloy, which is bonded directly to the other side of the ceramic substrate, is preferably formed by injecting the molten metal of aluminum or the aluminum alloy into the mold so that the molten metal contacts the other side of the ceramic substrate.

According to these aspects of the present invention, even if a base plate of aluminum or an aluminum alloy is formed so as to surround a metal plate of a metal, which has a higher thermal conductivity than that of aluminum or the aluminum alloy, when a metal/ceramic bonding substrate integrated with the base plate is produced by the molten metal bonding method, it is possible to produce the metal/ceramic bonding substrate which can prevent the formation of an intermetallic compound or solid solution of the metal and Al and which can prevent the diffusion of the metal and Al.

BEST MODE FOR CARRYING OUT THE INVENTION

Referring to the accompanying drawings, the preferred embodiments of a metal/ceramic bonding substrate according to the present invention, and a method for producing the same will be described below.

[First Preferred Embodiment]

As shown in FIGS. 1A through 1D, the first preferred embodiment of a metal/ceramic bonding substrate according to the present invention comprises: a metal base plate 10 of a metal having a substantially rectangular planar shape; a ceramic substrate 12 having a substantially rectangular planar shape, one side of the ceramic substrate 12 being bonded directly to the metal base plate 10; and a circuit pattern forming metal plate 14 of a metal which has a substantially rectangular planar shape and which is bonded directly to the other side of the ceramic substrate 12.

Figure 1A:
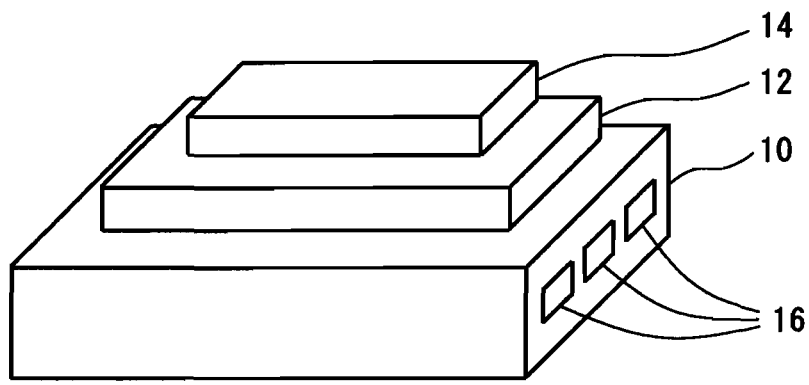
FIG. 1A is a perspective view showing the first preferred embodiment of a metal/ceramic bonding substrate according to the present invention.
Figure 1B:
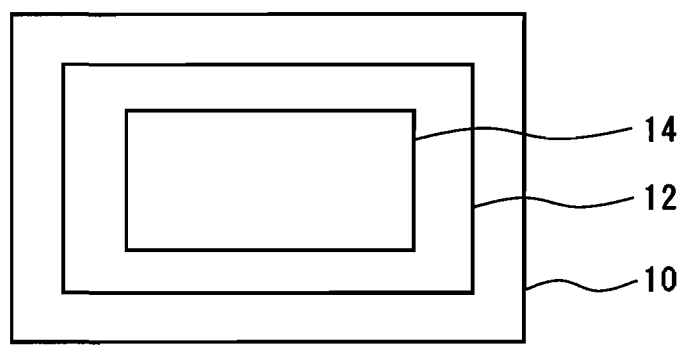
FIG. 1B is a plan view of the metal/ceramic bonding substrate of FIG. 1A.
Figure 1C:
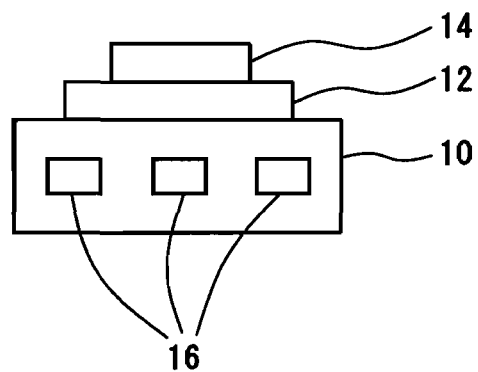
FIG. 1C is a side view of the metal/ceramic bonding substrate viewed from the right side in FIG. 1B.
Figure 1D:
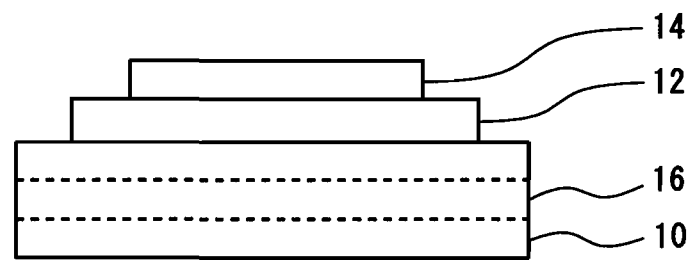
FIG. 1D is a side view of the metal/ceramic bonding substrate viewed from the bottom side in FIG. 1B.

As shown in FIGS. 1A, 1C and 1D, a plurality of reinforcing plate or rod members 16 of a metal (three elongated reinforcing plate members 16 having rectangular planar and sectional shapes in this preferred embodiment) pass through the interior of the metal base plate 10 from one of both end faces of the metal base plate 10 in longitudinal directions to the other end face thereof to extend in longitudinal directions thereof. Both end faces of each of the reinforcing members 16 in longitudinal directions are exposed to the outside. The whole surface of each of the reinforcing members 16 except for the both end faces thereof (the whole surface of a portion of each of the reinforcing members 16 passing through the metal base plate 10 to extend therein) is bonded directly to the metal base plates 10. By the reinforcing members 16 thus passing through the interior of the metal base plate 10 from one of the both end faces of the metal base plate 10 in the longitudinal directions to the other end face thereof to extend in the longitudinal directions thereof, it is possible to decrease the warpage and variation in warpage of the metal/ceramic bonding substrate, particularly the warpage and variation in warpage of the metal/ceramic bonding substrate in the longitudinal directions.

The reinforcing members 16 are arranged on a plane (an imaginary plane) substantially parallel to the bonded surface of the metal base member 10 to the ceramic substrate 12, and are spaced from each other to extend in substantially parallel to each other (two of the reinforcing members 16 are arranged on both sides of a central one of the reinforcing members 16 in this preferred embodiment). If gaps are thus provided between the adjacent reinforcing members 16 to be arranged directly below electronic parts, such as power elements, which are mounted on the metal plate 14, when heat generated from the electronic parts, such as the power elements, conducts through the insulating ceramic substrate 12 and the metal base plate 10 downwards to be radiated, heat conduction to the bottom face of the metal base plate 10 (the opposite surface to the bonded surface of the metal base plate 10 to the ceramic substrate 12) is not inhibited, so that it is possible to provide a metal/ceramic bonding substrate having excellent radiating performance.

The metal base plate 10 and the metal plate 14 are preferably made of aluminum or an aluminum alloy from the standpoints of electric conductivity, thermal conductivity and reliability of bonding to the ceramic substrate. The ceramic substrate 12 is preferably made of at least one of alumina, aluminum nitride, silicon nitride and silicon carbide. The reinforcing members 16 are preferably made of a metal which has a higher melting point and a higher strength than those of the metal base plate 10, and more preferably made of a steel or iron containing metal which is inexpensive and which has a high strength. The iron containing metal is preferably a metal which contains iron and at least one selected from the group consisting of nickel, cobalt, copper and manganese. In particular, the metal/ceramic bonding substrate is easy to greatly warp by thermal stress generated during bonding due to the difference in thermal expansion coefficient between the metal and the ceramic and/or by thermal stress generated during a heat treatment for mounting electronic parts, such as power elements, on the metal/ceramic bonding substrate and/or during the use of the metal/ceramic bonding substrate. In order to suppress such warpage, the reinforcing members 16 are preferably made of 42 Alloy (an alloy containing nickel mixed with iron), inver (an alloy of iron and nickel, nondeforming steel), kovar (an alloy containing nickel, cobalt and so forth mixed with iron), which have a low thermal expansion coefficient, SPPC (common steel) having a high strength, or the like. The thickness of each of the reinforcing members 16 is preferably in the range of from 0.5 mm to 2.0 mm. Each of the reinforcing members 16 is preferably coated with Ni plating or the like in order to suppress a reaction with the metal base plate 10.

The metal/ceramic bonding substrate in the preferred embodiment shown in FIGS. 1A through 1D can be produced by a method comprising the steps of: allowing the peripheral portion of the ceramic substrate 12 and both ends of each of the reinforcing members 16 in longitudinal directions to be supported on the mold 20 so as to arrange the ceramic substrate 12 and the reinforcing members 16 at predetermined intervals in the mold 20 shown in FIGS. 2A through 2D; injecting a molten metal into the mold 20 so that the molten metal contacts both faces of the ceramic substrate 12 and the whole surface of each of the reinforcing members 16 except for both end portions thereof in longitudinal directions; and then, cooling the mold 20.

Figure 2A:
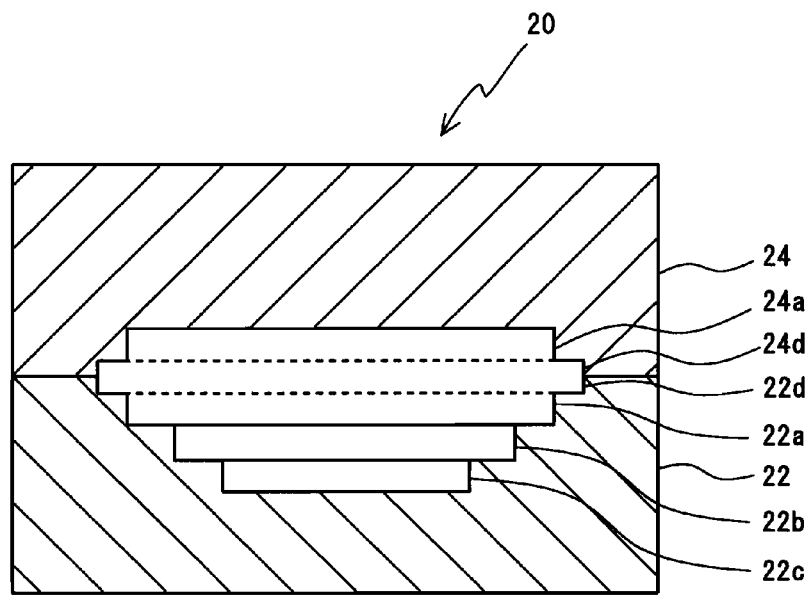
FIG. 2A is a sectional view of a mold used for producing the metal/ceramic bonding substrate shown in FIGS. 1A through 1D.

As shown in FIG. 2A, the mold 20 of carbon or the like comprises a lower mold member 22 and an upper mold member 24, each of which has a substantially rectangular planar shape.

Figure 2B:
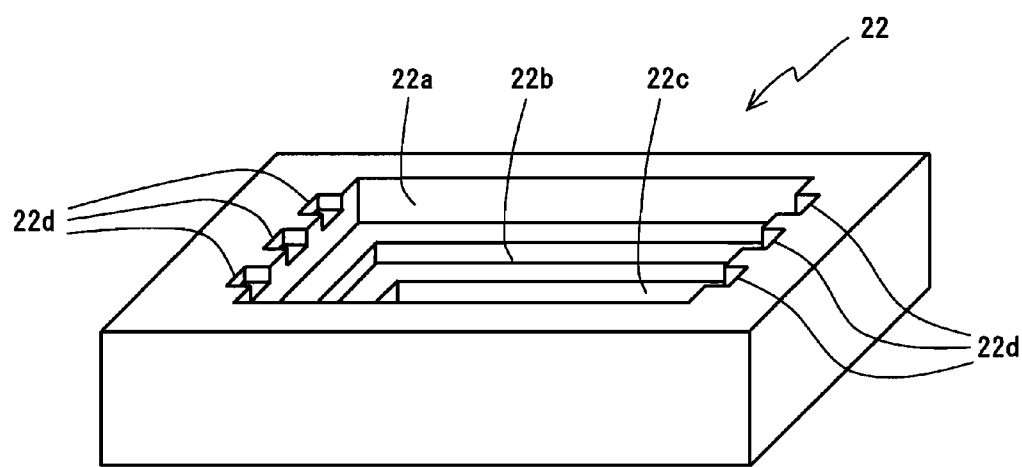
FIG. 2B is a perspective view of a lower mold member of the mold of FIG. 2A.
Figure 2C:
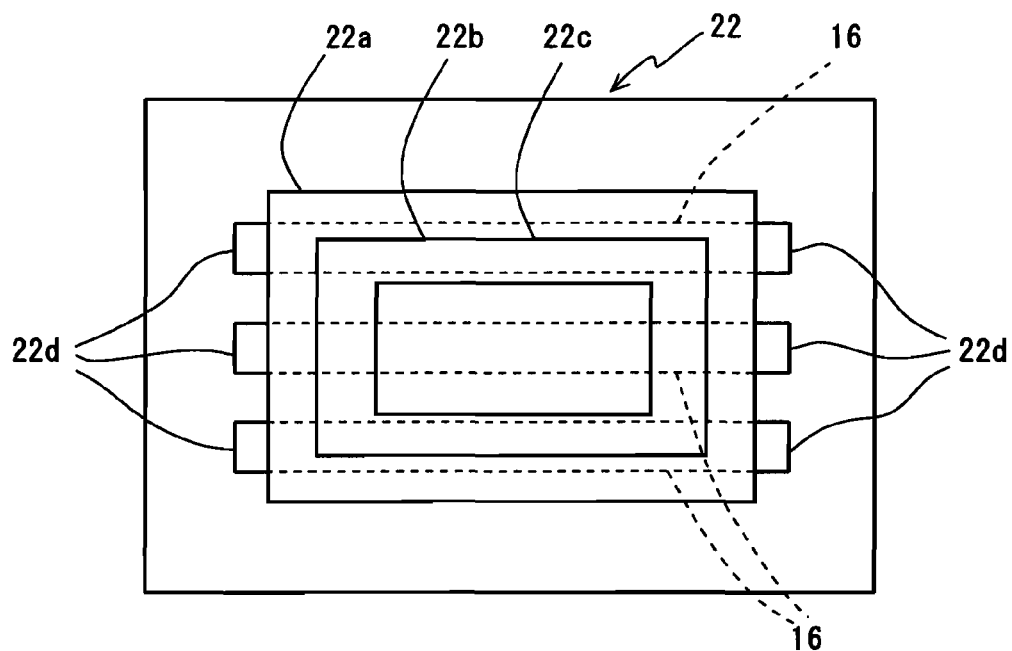
FIG. 2C is a plan view of the lower mold member of the mold of FIG. 2A.

As shown in FIGS. 2A through 2C, the top face of the lower mold member 22 has a recessed portion (a metal base plate forming portion) 22a for forming a portion (a substantially half in this preferred embodiment) of the metal base plate 10 on the side of the ceramic substrate 12. The bottom face of the recessed portion 22a has a recessed portion (a ceramic substrate housing portion) 22b, which substantially has the same shape and size as those of the ceramic substrate 12, for housing therein the ceramic substrate 12. The bottom face of the recessed portion 22b has a recessed portion (a metal plate forming portion) 22c for forming a metal plate 14 for a circuit pattern. The upper portion of each of both side faces of the metal base plate forming portion 22a in longitudinal directions has recessed portions (reinforcing member supporting portions) 22d, each of which substantially has the same shape and size as those of a portion (a substantially half in this preferred embodiment) of a corresponding one of both end portions in longitudinal directions of a corresponding one of the reinforcing members 16 on the side of the ceramic substrate 12 and which are spaced from each other, for housing therein the portion thereof.

Figure 2D:
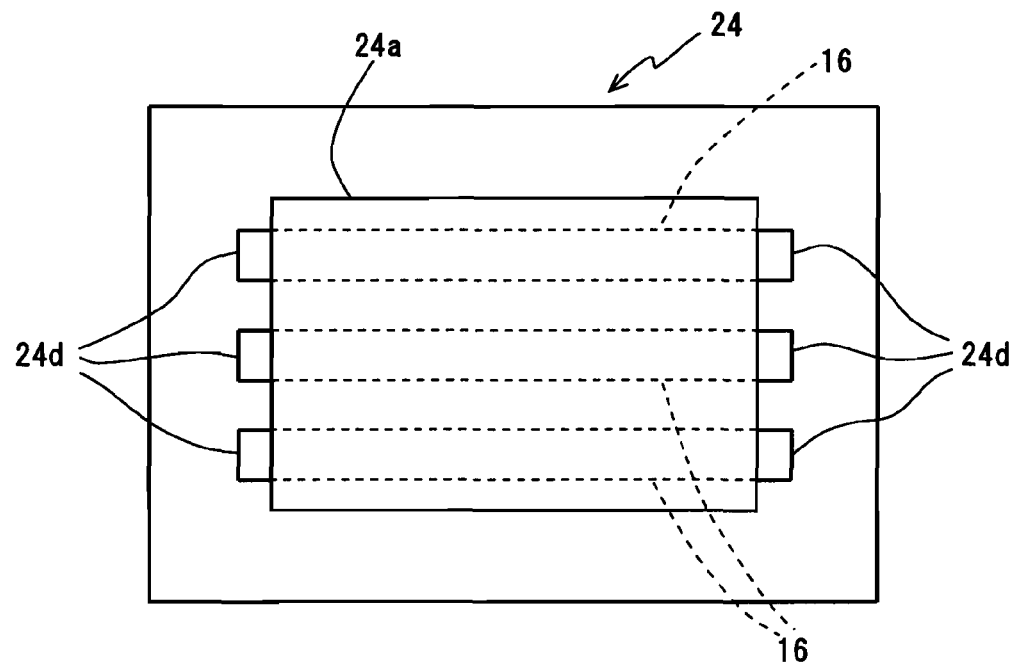
FIG. 2D is a bottom view of an upper mold member of the mold of FIG. 2A.

As shown in FIGS. 2A and 2D, the under surface (reverse face) of the upper mold member 24 has a recessed portion (a metal base plate forming portion) 24a for forming a portion (a substantially half in this preferred embodiment) of the metal base plate 10 on the opposite side to the ceramic substrate 12. The metal base plate 10 is designed to be formed in a space defined by the metal base plate forming portion 24a and the metal base plate forming portion 22a of the lower mold member 22. The upper portion (lower portion in FIG. 2A) of each of both side faces of the recessed portion 24a in longitudinal directions has recessed portions (reinforcing member supporting portions) 24d, each of which substantially has the same shape and size as those of a portion (a substantially half in this preferred embodiment) of each of both end portions in longitudinal directions of each of the reinforcing members 16 on the opposite side of the ceramic substrate 12 and which are spaced from each other, for housing therein the portion thereof. The reinforcing members 16 are designed to be clamped between the reinforcing member supporting portions 22d of the lower mold member 22 and the reinforcing member supporting portions 24d of the upper mold member 24 when the lower mold member 22 is covered with the upper mold member 24 after the reinforcing members 16 are housed in the reinforcing member supporting portions 22d of the lower mold member 22. When the reinforcing members 16 are thus clamped, it is possible to precisely fix the reinforcing members 16 at predetermined positions (at predetermined positions in directions along a main plane of the metal base plate 10 and in thickness directions thereof), so that it is possible to produce a metal/ceramic bonding substrate which has a small amount of warpage and a small variation in warpage and which particularly has a small amount of warpage in longitudinal directions and a small variation in warpage in longitudinal directions.

The upper mold member 24 has an inlet (not shown) for injecting a molten metal into the metal base plate forming portion 24a from an injecting nozzle (not shown). The lower mold member 22 has a molten metal passage (not shown) which extends between the metal base plate forming portion 22a and the metal plate forming portion 22c for establishing a communication between the metal base plate forming portion 22a and the metal plate forming portion 22c even if the ceramic substrate 12 is housed in the ceramic substrate housing portion 22b.

In this preferred embodiment, the metal base plate forming portion 22a of the lower mold member 22 and the metal base plate forming portion 24a of the upper mold member 24 have the recessed portions 22d and the recessed portions 24d as the reinforcing member supporting portions, respectively. However, the metal base plate forming portion 22a of the lower mold member 22 or the metal base plate forming portion 24a of the upper mold member 24 may have recessed portions, each of which has the same shape and size as those of a corresponding one of both end portions of a corresponding one of the reinforcing members 16 in longitudinal directions.

In order to use such a mold 20 for producing the preferred embodiment of a metal/ceramic bonding substrate shown in FIG. 1A through 1D, after the ceramic substrate 12 is arranged in the ceramic substrate housing portion 22b of the lower mold member 22, the reinforcing members 16 are put on the reinforcing member supporting portions 22d of the lower mold member 22, and then, the lower mold member 22 is covered with the upper mold member 24. In this state, if a molten metal of aluminum, an aluminum alloy or the like is injected into the mold 20 and cooled, it is possible to produce a metal/ceramic bonding substrate wherein the metal base plate 10 having the reinforcing members 16 therein, the both end portions of each of the reinforcing members 16 in longitudinal directions protruding from side faces of the metal base plate 10, is bonded directly to one side of the ceramic substrate 12 and wherein the metal plate 14 for a circuit pattern is bonded directly to the other side of the ceramic substrate 12. Thereafter, the both end portions of each of the reinforcing members 16 in the longitudinal directions thereof, the both end portions protruding from the metal base plate 10, are cut by a well-known cutting method, so that it is possible to produce the preferred embodiment of a metal/ceramic bonding substrate shown in FIGS. 1A through 1D.

The molten metal is preferably injected into the mold 20 as follows. First, the mold 20 is moved into a furnace (not shown), and the interior of the furnace is caused to be in an atmosphere of nitrogen to decrease the oxygen concentration therein to 100 ppm or less, preferably 10 ppm or less. Then, the mold 20 is heated to a molten metal injecting temperature (e.g., 600 to 800° C. when a molten metal of aluminum is injected) by the temperature control of a heater. Thereafter, a molten metal, which is heated to the molten metal injecting temperature and which is previously measured, is pressurized at a predetermined pressure by nitrogen gas to be injected into the mold 20 from the inlet. If the molten metal is thus injected, it is possible to prevent large bonding defects from being produced between the metal and the ceramic. After the molten metal is injected into the mold 20, nitrogen gas is preferably blown into the inlet from a nozzle (not shown) to cool and solidify the molten metal in the mold 20 while pressurizing the molten metal at a predetermined pressure. The predetermined pressure applied by nitrogen gas during the injection and cooling of the molten metal is preferably in the range of from 1 kPa to 100 kPa, more preferably in the range of from 3 kPa to 80 kPa, and most preferably in the range of from 5 kPa to 15 kPa. If the pressure is too low, it is difficult to allow the molten metal to be injected into the mold 20. If the pressure is too high, there is the possibility that the positions of the reinforcing members 16 may be shifted and/or the mold 20 may be damaged. In particular, when a high pressure of not less than 1 MPa is applied if the mold 20 of carbon is used, there is the possibility that the mold 20 may be broken and/or the molten metal may leak from the mold 20 and/or the positions of the reinforcing members 16 and ceramic substrate 12 may be shifted.

Figure 3:
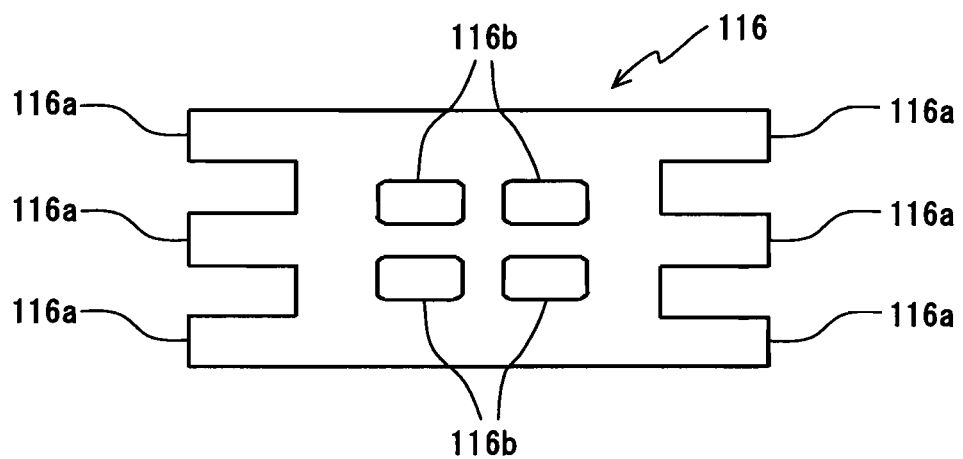
FIG. 3 is a plan view showing a first modified example of a reinforcing member of the metal/ceramic bonding substrate shown in FIGS. 1A through 1D.

FIG. 3 shows a reinforcing member 116 as a first modified example of the reinforcing members 16 of the above-described preferred embodiment of a metal/ceramic bonding substrate according to the present invention. The reinforcing member 116 is a single plate member which is designed to be arranged on a plane (an imaginary plane) substantially parallel to the bonded surface of the metal base plate 10 to the ceramic substrate 12 and wherein the area of a portion of the plane substantially parallel to the bonded surface is smaller than that of the bonded surface. The reinforcing member 116 is a lattice-shaped plate member, which comprises a plurality (three in the shown example) of longitudinal plate portions being spaced from each other and extending in longitudinal directions, and a plurality (three in the shown example) of lateral plate portions being spaced from each other and extending in lateral directions (width directions) substantially perpendicular to the longitudinal directions for connecting the longitudinal plate portions to each other. The both end portions 116a of each of the longitudinal plate portions of the reinforcing member 116 are designed to substantially have the same shape and size as those of the spaces defined by the reinforcing member supporting portions 22d and 24d of the mold 20. When the reinforcing member 116 in this modified example is used, it is not only possible to reduce the warpage and variation in warpage of the metal/ceramic bonding substrate in longitudinal directions, but it is also possible to reduce the warpage and variation in warpage of the metal/ceramic bonding substrate in lateral directions. If the openings 116b surrounded by the longitudinal and lateral plate portions of the reinforcing member 116 are designed to be arranged directly below power elements mounted on the metal plate 14, it is possible to provide a metal/ceramic bonding substrate having excellent heat conduction by preventing heat conduction to the bottom face of the metal base plate 10 from being inhibited. Since other constructions are same as those in the above-described preferred embodiment, the description thereof is omitted.

Figure 4:
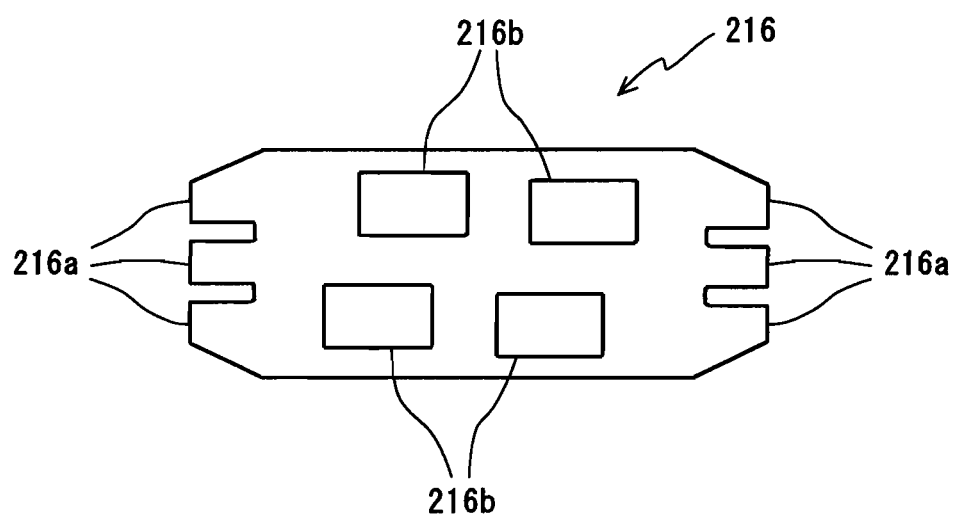
FIG. 4 is a plan view showing a second modified example of a reinforcing member of the metal/ceramic bonding substrate shown in FIGS. 1A through 1D.

FIG. 4 shows a reinforcing member 216 as a second modified example of the reinforcing members 16 of the above-described preferred embodiment of a metal/ceramic bonding substrate according to the present invention. In this reinforcing member 216, the size and position of each of openings 216a, and the shape of each of both end portions 216a of longitudinal plate portions are different from those of the reinforcing member 116 in the above-described first modified example. If the openings 216b surrounded by the longitudinal and lateral plate portions of the reinforcing member 116 are designed to be arranged directly below power elements mounted on the metal plate 14, it is possible to provide a metal/ceramic bonding substrate having excellent heat conduction by preventing heat conduction to the bottom face of the metal base plate 10 from being inhibited. Furthermore, each of the corner portions of the reinforcing member 216 has an inclined plane which is inclined with respect to the side faces in longitudinal and lateral directions. In addition, the size and shape of each of both end portions of each of longitudinal plate portions are different from those of the reinforcing member 116 in the above-described first modified example. Therefore, the shape and size of each of the reinforcing member supporting portions 22d and 24d of the mold 20 may be modified so as to correspond to the modification thereof. Since other constructions are same as those in the above-described first modified example, the description thereof is omitted.

Furthermore, when the metal base plate 10 has mounting holes for mounting a heat sink thereon by means of screws, if holes are formed in the reinforcing member so as to correspond to the mounting holes and if the mounting holes of the metal base plate 10 are arranged so as to be surrounded by the reinforcing member, it is possible to improve the strength of the screwed portions. Since the screwed portions hardly have an influence on heat radiation, the reinforcing member may be exposed to the outside from the metal base plate 10 in the screwed portions.

Examples of the first preferred embodiment of a metal/ceramic bonding substrate and a method for producing the same according to the present invention will be described below in detail.

EXAMPLE 1

First, there was prepared a mold of carbon having a similar shape to that of the mold 20 shown in FIGS. 2A through 2D, except that the bottom face of the metal base plate forming portion 22a has two ceramic substrate housing portions 22b spaced from each other and that the bottom face of each of the ceramic substrate housing portions 22b has a metal plate forming portion 22c. There were also prepared two ceramic substrates 12 of AlN having a size of 50 mm×50 mm×0.6 mm, and three reinforcing members 16 of 42 Alloy having a size of 150 mm×15 mm×0.6 mm. Then, the ceramic substrates 12 were arranged in the ceramic substrate housing portions 22b of the lower mold member 22 of the mold 20, respectively, and both end portions (portions having a length of 5 mm) of each of the reinforcing members 16 were arranged in the reinforcing member supporting portions 22d of the lower mold member 22, respectively. Thereafter, the lower mold member 22 was covered with the upper mold member 24 of the mold 20 to be put in a furnace, and the interior of the furnace was caused to be in an atmosphere of nitrogen to decrease the oxygen concentration therein to 4 ppm or less. In this state, the mold 20 was heated to 720° C. by the temperature control of a heater, and then, a molten metal of aluminum having a purity of 99.9%, which was heated to 720° C. and previously measured, was poured into the mold 20 from an injecting nozzle mounted on the inlet of the mold 20 while being pressurized at 10 kPa by nitrogen gas. Thus, the molten metal was filled in the metal base plate forming portions 22a and 24a having a size of 140 mm×60 mm×5 mm in the mold 20, and in each of the metal plate forming portions 22c having a size of 48 mm×48 mm×0.6 mm via a molten metal passage formed in the lower mold member 22. Thereafter, nitrogen gas was blown into the inlet from the injecting nozzle to cool and solidify the molten metal in the mold 20 while pressurizing the molten metal at 10 kPa. Thus, by a so-called molten metal bonding method, there was produced a metal/ceramic bonding substrate wherein the metal base plate 10 having a size of 140 mm×60 mm×5 mm was bonded directly to one side of each of the ceramic substrates 12 having a size of 50 mm×50 mm×0.6 mm, wherein three reinforcing members 16 having a size of 150 mm×15 mm×0.6 mm passed through the metal base plate 10, both end portions (portions having a length of 5 mm) of each of the reinforcing members 16 in longitudinal directions protruding from the side faces of the metal base plate 10, and wherein the metal plate 14 for a circuit pattern having a size of 48 mm×48 mm×0.6 mm was bonded directly to the other side of each of the ceramic substrates 12. After the metal/ceramic bonding substrate was ejected from the mold 20, the both end portions of each of the reinforcing members 16 in longitudinal directions, the end portions protruding from the metal base plate 10, was cut to be removed, so that there was produced a metal/ceramic bonding substrate having a similar shape to that shown in FIGS. 1A through 1D, except that the two ceramic substrates 12 were bonded directly to the metal base plate 10 and that the metal member 14 for a circuit pattern was bonded directly to each of the ceramic substrate 12.

With respect to the metal/ceramic bonding substrate thus obtained, the amount of warpage of the metal base plate 10 in longitudinal directions (the distance in vertical directions between the tangential plane of the central portion of the metal base plate 10 and one of the end portions thereof when the bottom face of the metal base plate 10 was arranged on the horizontal plane) was measured by a laser displacement meter, assuming that the amount of warpage was positive (+) when the metal base plate 10 warps downwardly (concavely) and negative (−) when the metal base plate 10 warps upwardly (convexly). As a result, the amount of warpage in the longitudinal directions of the ceramic substrate 12 was −10 μm.

With respect to the metal/ceramic bonding substrate heated on a hot plate to cause the surface temperature of the substrate to be 260° C., the amount of warpage in longitudinal directions of the ceramic substrate 12 was measured. As a result, the amount of warpage in longitudinal directions of the ceramic substrate 12 was +200 μm.

After heating, the ceramic substrate 12 has no deficiencies such as cracks, and the electrical performance such as insulating performance of the metal/ceramic bonding substrate was good. The bonding of the metal plate 14 to the ceramic substrate 12, the bonding of the metal base plate 10 to the substrate 12, and the bonding of the metal base plate 10 to the reinforcing members 16 were good without causing any deficiencies.

EXAMPLE 2

There was produced a metal/ceramic bonding substrate by the same method as that in Example 1, except that there were used a single reinforcing member 16 having a size of 150 mm×50 mm×1.0 mm and a mold 20 corresponding thereto.

With respect to the metal/ceramic bonding substrate thus obtained, the amount of warpage of the metal base plate 10 was measured by the same method as that in Example 1. As a result, the amount of warpage in longitudinal directions of the ceramic substrate 12 was +10 μm.

With respect to the metal/ceramic bonding substrate heated on a hot plate to cause the surface temperature of the substrate to be 260° C., the amount of warpage in longitudinal directions of the ceramic substrate 12 was measured. As a result, the amount of warpage in longitudinal directions of the ceramic substrate 12 was +298 μm.

EXAMPLE 3

There was produced a metal/ceramic bonding substrate by the same method as that in Example 1, except that there were used a single reinforcing member 16 having a size of 150 mm×50 mm×0.6 mm and a mold 20 corresponding thereto.

With respect to the metal/ceramic bonding substrate thus obtained, the amount of warpage of the metal base plate 10 was measured by the same method as that in Example 1. As a result, the amount of warpage in longitudinal directions of the ceramic substrate 12 was −20 μm.

With respect to the metal/ceramic bonding substrate heated on a hot plate to cause the surface temperature of the substrate to be 260° C., the amount of warpage in longitudinal directions of the ceramic substrate 12 was measured. As a result, the amount of warpage in longitudinal directions of the ceramic substrate 12 was +500 μm.

COMPARATIVE EXAMPLE 1

There was produced a metal/ceramic bonding substrate by the same method as that in Example 1, except that there were used no reinforcing member and a mold 20 corresponding thereto.

With respect to the metal/ceramic bonding substrate thus obtained, the amount of warpage of the metal base plate 10 was measured by the same method as that in Example 1. As a result, the amount of warpage in longitudinal directions of the ceramic substrate 12 was −30 μm.

With respect to the metal/ceramic bonding substrate heated on a hot plate to cause the surface temperature of the substrate to be 260° C., the amount of warpage in longitudinal directions of the ceramic substrate 12 was measured. As a result, the amount of warpage in longitudinal directions of the ceramic substrate 12 was +900 μm.

[Second Preferred Embodiment]

Figure 5A:
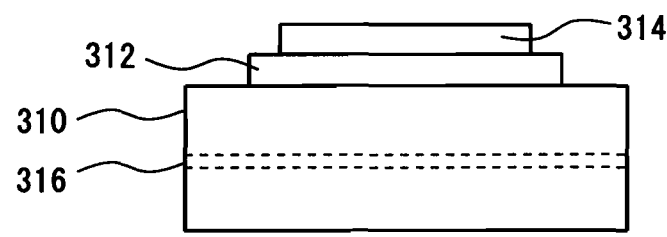
FIG. 5A is a side view showing the second preferred embodiment of a metal/ceramic bonding substrate according to the present invention.
Figure 5B:
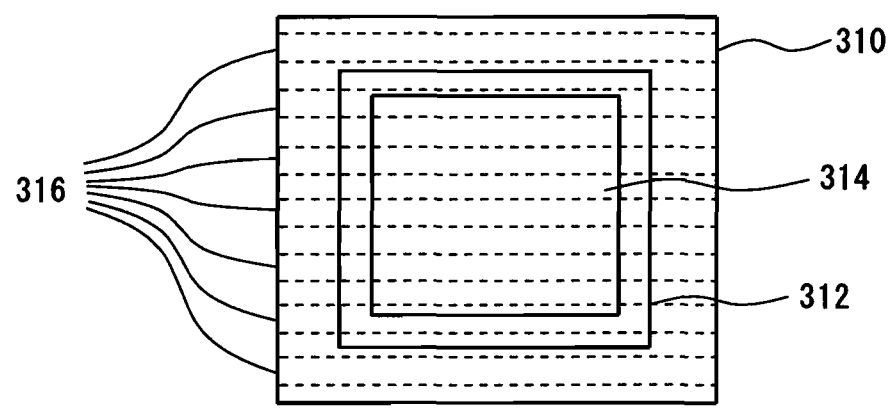
FIG. 5B is a plan view of the metal/ceramic bonding substrate of FIG. 5A.

As shown in FIGS. 5A and 5B, the second preferred embodiment of a metal/ceramic bonding substrate according to the present invention comprises: a metal base plate 310 of a metal having a substantially rectangular planar shape; at least one (one in this preferred embodiment) ceramic substrate 312 having a substantially rectangular planar shape, one side of the ceramic substrate 312 being bonded directly to the metal base plate 310; and a circuit pattern forming metal plate 314 of a metal which has a substantially rectangular planar shape and which is bonded directly to the other side of the ceramic substrate 312.

As shown in FIGS. 5A and 5B, one or a plurality of reinforcing plate or rod members 316 of a ceramic (seven elongated reinforcing plate members 316 having rectangular planar and sectional shapes in this preferred embodiment) pass through the interior of the metal base plate 310 from one of both end faces of the metal base plate 310 in longitudinal (or lateral) directions to the other end face thereof to extend in longitudinal (or lateral) directions thereof. Furthermore, the thickness (in the thickness directions of the metal base plate 310) of each of the reinforcing members 316 is smaller than the width (in directions along the bonded surface of the metal base plate 310 to the ceramic substrate 312) thereof. Both end faces of each of the reinforcing members 316 in longitudinal directions are exposed to the outside. The whole surface of each of the reinforcing members 316 except for the both end faces thereof (the whole surface of a portion of each of the reinforcing members 316 passing through the interior of the metal base plate 310 to extend therein) is bonded directly to the metal base plates 310. By the reinforcing members 316 thus passing through the interior of the metal base plate 310 from one of both end faces of the metal base plate 310 in longitudinal (or lateral) directions to the other end face thereof to extend in longitudinal (or lateral) directions thereof, it is possible to decrease the warpage and variation in warpage of the metal/ceramic bonding substrate.

The reinforcing members 316 are arranged on a plane (an imaginary plane) substantially parallel to the bonded surface of the metal base member 310 to the ceramic substrate 312, and are spaced from each other to extend in substantially parallel to each other (three of the reinforcing members 316 are arranged on each of both sides of a central one of the reinforcing members 316 in this preferred embodiment). If gaps are thus provided between the adjacent reinforcing members 316 to be arranged directly below electronic parts, such as power elements, which are mounted on the metal plate 314, when heat generated from the electronic parts, such as the power elements, conducts through the insulating ceramic substrate 312 and the metal base plate 310 downwards to be radiated, heat conduction to the bottom face of the metal base plate 310 is not inhibited, so that it is possible to provide a metal/ceramic bonding substrate having excellent radiating performance.

The metal base plate 310 and the metal plate 314 are preferably made of aluminum or an aluminum alloy from the standpoints of electric conductivity, thermal conductivity and reliability of bonding to the ceramic substrate. The ceramic substrate 312 and the reinforcing members 316 are preferably made of at least one of alumina, aluminum nitride, silicon nitride and silicon carbide.

Figure 6:
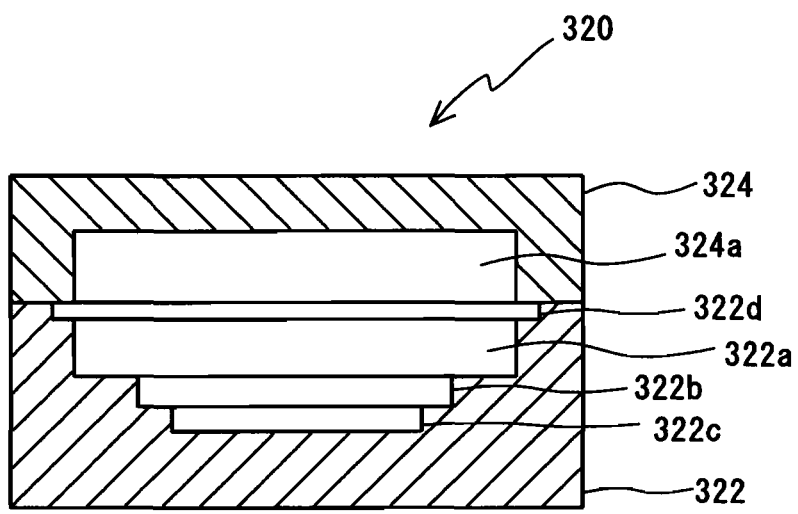
FIG. 6 is a sectional view of a mold used for producing the metal/ceramic bonding substrate shown in FIGS. 5A and 5B.

The metal/ceramic bonding substrate in the preferred embodiment shown in FIGS. 5A and 5B can be produced by a method comprising the steps of: allowing the peripheral portion of the ceramic substrate 312 and both end portions of each of the reinforcing members 316 in longitudinal directions to be supported on the mold 320 so as to arrange the ceramic substrate 312 and the reinforcing members 316 at predetermined intervals in the mold 320 shown in FIG. 6; injecting a molten metal into the mold 320 so that the molten metal contacts both surfaces of the ceramic substrate 312 and the whole surface of each of the reinforcing members 316 except for both end portions thereof in longitudinal directions; and then, cooling the mold 320.

As shown in FIG. 6, the mold 320 of carbon or the like comprises a lower mold member 322 and an upper mold member 324, each of which has a substantially rectangular planar shape.

As shown in FIG. 6, the top face of the lower mold member 322 has a recessed portion (a metal base plate forming portion) 322a for forming a portion (a substantially half in this preferred embodiment) of the metal base plate 310 on the side of the ceramic substrate 312. The bottom face of the recessed portion 322a has a recessed portion (a ceramic substrate housing portion) 322b, which substantially has the same shape and size as those of the ceramic substrate 312, for housing therein the ceramic substrate 312. The bottom face of the recessed portion 322b has a recessed portion (a metal plate forming portion) 322c for forming a metal plate 314 for a circuit pattern. The upper portion of each of both side faces of the metal base plate forming portion 322a in longitudinal directions has recessed portions (reinforcing member supporting portions) 322d, each of which substantially has the same shape and size as those of a corresponding one of both end portions in longitudinal directions of a corresponding one of the reinforcing members 316 and which are spaced from each other, for housing therein the corresponding one of the end portions thereof.

As shown in FIG. 6, the under surface (reverse face) of the upper mold member 324 has a recessed portion (a metal base plate forming portion) 324a for forming a portion (a substantially half in this preferred embodiment) of the metal base plate 310 on the opposite side to the ceramic substrate 312. The metal base plate 310 is designed to be formed in a space defined by the metal base plate forming portion 324a and the metal base plate forming portion 322a of the lower mold member 322. The reinforcing members 316 are designed to be clamped between the reinforcing member supporting portions 322d of the lower mold member 322 and the upper mold member 324 when the lower mold member 322 is covered with the upper mold member 324 after the reinforcing members 316 are housed in the reinforcing member supporting portions 322d of the lower mold member 322. When the reinforcing members 316 are thus clamped, it is possible to precisely fix the reinforcing members 316 at predetermined positions (at predetermined positions in directions along a main plane of the metal base plate 310 and in thickness directions thereof), so that it is possible to produce a metal/ceramic bonding substrate which has a small amount of warpage and a small variation in warpage.

The upper mold member 324 has an inlet (not shown) for injecting a molten metal into the metal base plate forming portion 324a from an injecting nozzle (not shown). The lower mold member 322 has a molten metal passage (not shown) which extends between the metal base plate forming portion 322a and the metal plate forming portion 322c for establishing a communication between the metal base plate forming portion 322a and the metal plate forming portion 322c even if the ceramic substrate 312 is housed in the ceramic substrate housing portion 322b.

In this preferred embodiment, the metal base plate forming portion 322d of the lower mold member 322 has recessed portions 322a as reinforcing member supporting portions. However, the metal base plate forming portion 324a of the upper mold member 324 may have recessed portions, each of which has the same shape and size as those of a corresponding one of both end portions in longitudinal directions of a corresponding one of the reinforcing members 316. Alternatively, both of the metal base plate forming portion 322a of the lower mold member 322 and the metal base plate forming portion 324a of the upper mold member 24 have recessed portions so that both end portions of each of the reinforcing members 316 have the same shape and size as those of a corresponding one of the spaces defined by the recessed portions.

In order to use such a mold 320 for producing the preferred embodiment of a metal/ceramic bonding substrate shown in FIGS. 5A and 5B, after the ceramic substrate 312 is arranged in the ceramic substrate housing portion 322b of the lower mold member 322, the reinforcing members 316 are put on the reinforcing member supporting portions 322d of the lower mold member 322, and then, the lower mold member 322 is covered with the upper mold member 324. In this state, if a molten metal of aluminum, an aluminum alloy or the like is injected into the mold 320 and cooled, it is possible to produce a metal/ceramic bonding substrate wherein the metal base plate 310 having the reinforcing members 316 being arranged therein, the both end portions of each of the reinforcing members 316 in longitudinal directions protruding from side faces of the metal base plate 310, is bonded directly to one side of the ceramic substrate 312 and wherein the metal plate 314 for a circuit pattern is bonded directly to the other side of the ceramic substrate 312. Thereafter, the both end portions of each of the reinforcing members 316 in the longitudinal directions thereof, the both end portions protruding from the metal base plate 310, are removed by a well-known cutting method, so that it is possible to produce the preferred embodiment of a metal/ceramic bonding substrate shown in FIGS. 5A and 5B.

The molten metal is preferably injected into the mold 320 as follows. First, the mold 320 is moved into a furnace (not shown), and the interior of the furnace is caused to be in an atmosphere of nitrogen to decrease the oxygen concentration therein to 100 ppm or less, preferably 10 ppm or less. Then, the mold 320 is heated to a molten metal injecting temperature (e.g., 600 to 800° C. when a molten metal of aluminum is injected) by the temperature control of a heater. Thereafter, a molten metal, which is heated to the molten metal injecting temperature and which is previously measured, is pressurized at a predetermined pressure by nitrogen gas to be injected into the mold 320 from the inlet. If the molten metal is thus injected, it is possible to prevent large bonding defects from being produced between the metal and the ceramic. After the molten metal is injected into the mold 320, nitrogen gas is preferably blown into the inlet from a nozzle (not shown) to cool and solidify the molten metal in the mold 320 while pressurizing the molten metal at a predetermined pressure. The predetermined pressure applied by nitrogen gas during the injection and cooling of the molten metal is preferably in the range of from 1 kPa to 100 kPa, more preferably in the range of from 3 kPa to 80 kPa, and most preferably in the range of from 5 kPa to 15 kPa. If the pressure is too low, it is difficult to allow the molten metal to be injected into the mold 320. If the pressure is too high, there is the possibility that the positions of the reinforcing members 316 may be shifted and/or the mold 320 may be damaged. In particular, when a high pressure of not less than 1 MPa is applied if the mold 320 of carbon is used, there is the possibility that the mold 320 may be broken and/or the molten metal may leak from the mold 320 and/or the positions of the reinforcing members 316 and ceramic substrate 312 may be shifted.

Figure 7A:
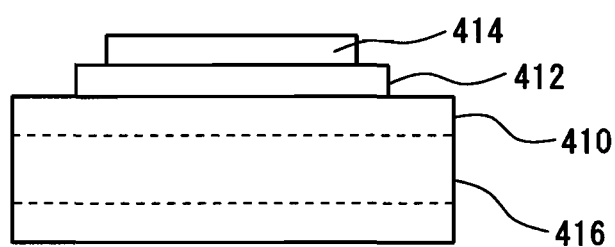
FIG. 7A is a side view showing a first modified example of the second preferred embodiment of the metal/ceramic bonding substrate according to the present invention.
Figure 7B:
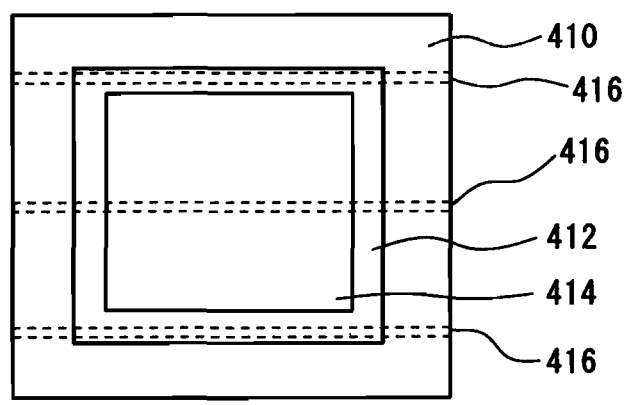
FIG. 7B is a plan view of the metal/ceramic bonding substrate of FIG. 7A.
Figure 8:
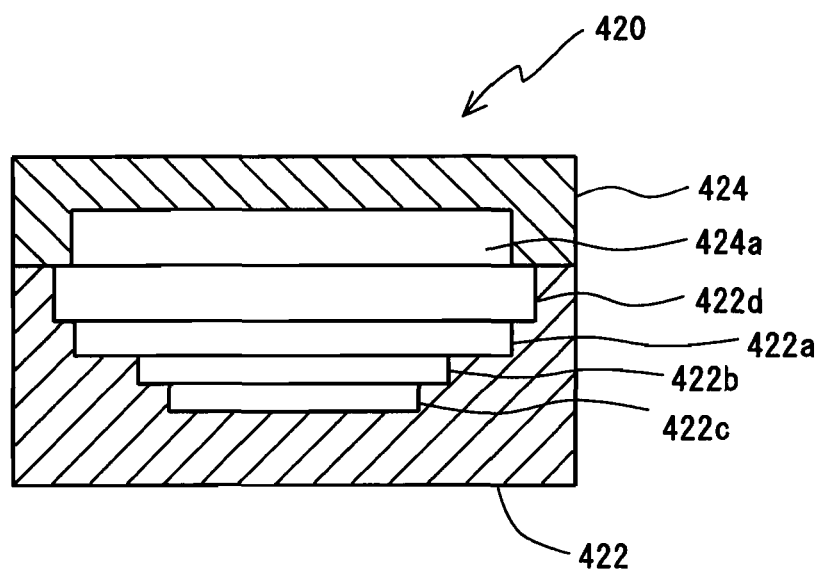
FIG. 8 is a sectional view of a mold used for producing the metal/ceramic bonding substrate shown in FIGS. 7A and 7B.

FIGS. 7A, 7B and 8 show a first modified example of a metal/ceramic bonding substrate in this preferred embodiment and a mold used for producing the same.

In this modified example, three elongated reinforcing plate members 416 having rectangular planar and sectional shapes are arranged on a plane (an imaginary plane) substantially parallel to the bonded surface of a metal base member 410 to a ceramic substrate 412, and are spaced from each other to extend in substantially parallel to each other (three reinforcing members 416 are arranged at regular intervals so that one of the reinforcing members 416 is arranged on each of both sides of a central one of the reinforcing members 416 in this preferred embodiment). The thickness (in the thickness directions of the metal base plate 410) of each of the reinforcing members 416 is greater than the width (in directions along the bonded surface of the metal base plate 410 to the ceramic substrate 412) thereof. Since other constructions are same as those in the above-described second preferred embodiment, 100 is added to each of the reference numbers of corresponding portions in the second preferred embodiment to be shown in the figures, and the description thereof is omitted.

In this modified example, since the thickness (in the thickness directions of the metal base plate 410) of each of the reinforcing members 416 is greater than the width (in directions along the bonded surface of the metal base plate 410 to the ceramic substrate 412) thereof, it is possible to produce a metal/ceramic bonding substrate which has excellent radiating performance in the thickness directions of the metal base plate 420 and which has a small amount of warpage and a small variation in warpage. That is, the area of each of the reinforcing members 416 for inhibiting heat radiation in the thickness directions of the metal base plate 420 is decreased by reducing the width (in directions along the bonded surface of the metal base plate 410 to the ceramic substrate 412) of a corresponding one of the reinforcing members 416. In addition, the reinforcing members 416 can be difficult to be bent with respect to the warpage of the metal base plate 410 by increasing the thickness (in the thickness directions of the metal base plate 410) of each of the reinforcing members 416. Moreover, it is possible to reduce costs by decreasing the used amount of the reinforcing members 416.

Figure 9A:
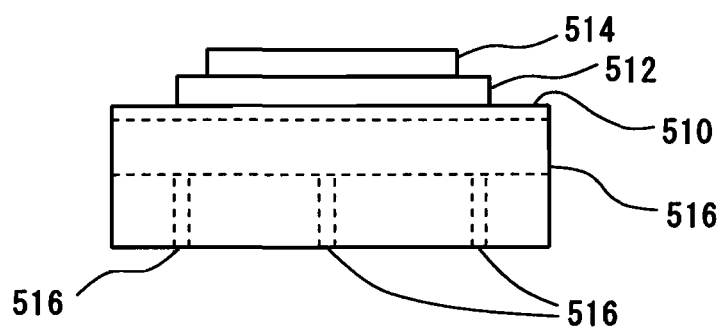
FIG. 9A is a side view showing a second modified example of the second preferred embodiment of the metal/ceramic bonding substrate according to the present invention.
Figure 9B:
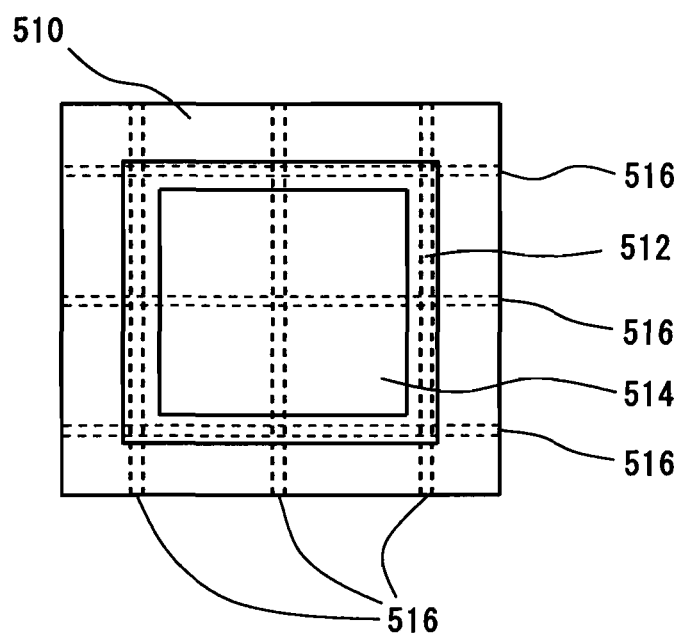
FIG. 9B is a plan view of the metal/ceramic bonding substrate of FIG. 9A.
Figure 10:
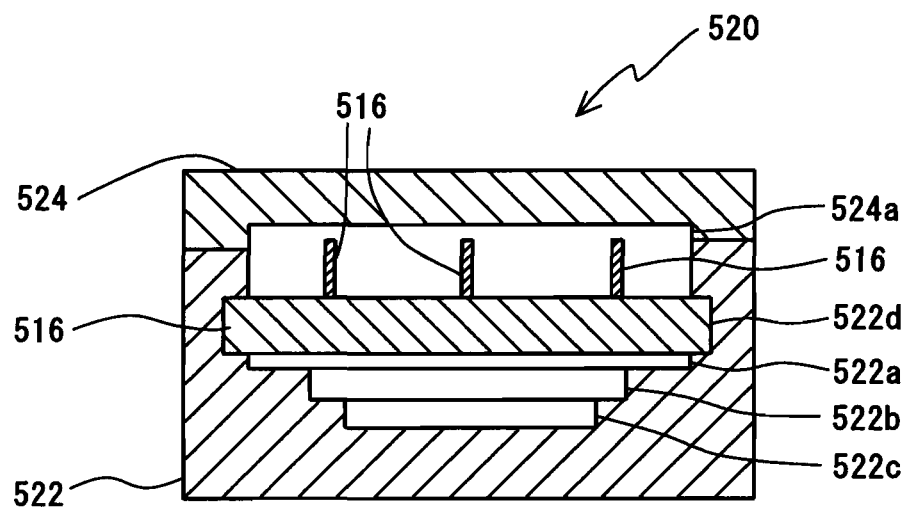
FIG. 10 is a sectional view of a mold used for producing the metal/ceramic bonding substrate shown in FIGS. 9A and 9B.

FIGS. 9A, 9B and 10 show a second modified example of a metal/ceramic bonding substrate in this preferred embodiment and a mold used for producing the same.

In this modified example, three elongated reinforcing plate members 516 having rectangular planar and sectional shapes are arranged on a plane (an imaginary plane) substantially parallel to the bonded surface of a metal base member 510 to a ceramic substrate 512, and are spaced from each other to extend in substantially parallel to each other (three reinforcing members 516 are arranged at regular intervals so that one of the reinforcing members 516 is arranged on each of both sides of a central one of the reinforcing members 516 in this preferred embodiment). In addition, similar three elongated reinforcing plate members 516 contact the bottom faces of the above-described three reinforcing members 516 and are spaced from each other to extend in directions substantially perpendicular to the above-described three reinforcing members 516 (three reinforcing members 516 are arranged at regular intervals so that one of the reinforcing members 516 is arranged on each of both sides of a central one of the reinforcing members 516 in this preferred embodiment). The thickness (in the thickness directions of the metal base plate 510) of each of the reinforcing members 516 is greater than the width (in directions along the bonded surface of the metal base plate 510 to the ceramic substrate 512) thereof. Since other constructions are same as those in the above-described second preferred embodiment, 200 is added to each of the reference numbers of corresponding portions in the second preferred embodiment to be shown in the figures, and the description thereof is omitted.

In this modified example, since the thickness (in the thickness directions of the metal base plate 510) of each of the reinforcing members 516 is greater than the width (in directions along the bonded surface of the metal base plate 510 to the ceramic substrate 512) thereof, it is possible to produce a metal/ceramic bonding substrate which has excellent radiating performance in the thickness directions of the metal base plate 510 and which has a small amount of warpage in longitudinal and lateral directions and a small variation in warpage. That is, the area of each of the reinforcing members 516 for inhibiting heat radiation in the thickness directions of the metal base plate 510 is decreased by reducing the width (in directions along the bonded surface of the metal base plate 510 to the ceramic substrate 512) thereof. In addition, the reinforcing members 516 can be difficult to be bent with respect to the warpage of the metal base plate 510 in longitudinal and lateral directions by increasing the thickness (in the thickness directions of the metal base plate 510) of each of the reinforcing members 516. Moreover, it is possible to reduce costs by decreasing the used amount of the reinforcing members 516.

Figure 11A:
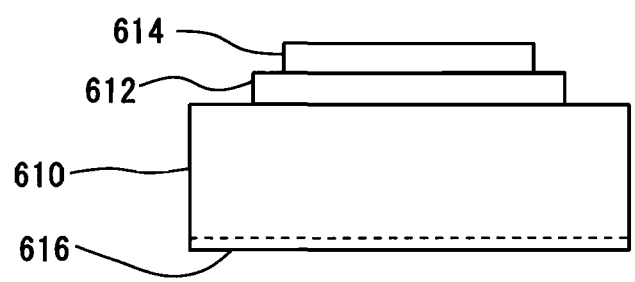
FIG. 11A is a side view showing a third modified example of the second preferred embodiment of the metal/ceramic bonding substrate according to the present invention.
Figure 11B:
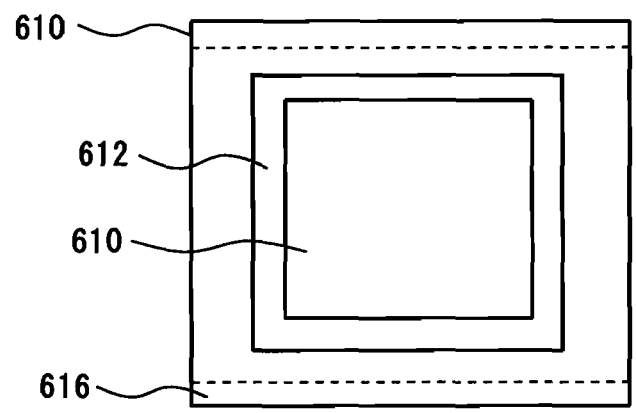
FIG. 11B is a plan view of the metal/ceramic bonding substrate of FIG. 11A.
Figure 12:
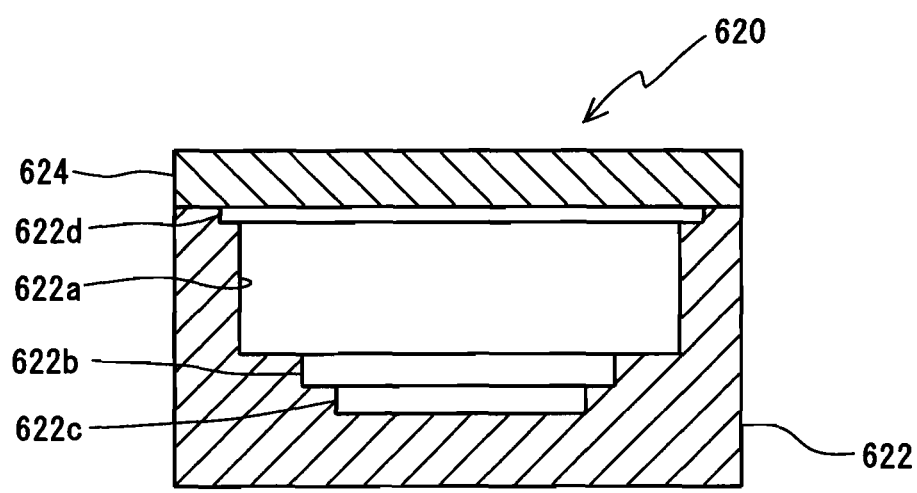
FIG. 12 is a sectional view of a mold used for producing the metal/ceramic bonding substrate shown in FIGS. 11A and 11B.

FIGS. 11A, 11B and 12 show a third modified example of a metal/ceramic bonding substrate in this preferred embodiment and a mold used for producing the same.

In this modified example, a single reinforcing plate member 616, which is narrower than the width of the bottom face of a metal base plate 610 and which has the same length as that of the bottom face thereof, is arranged on the central portion of the bottom face of the metal base plate 610 in longitudinal directions so as to extend over the whole length of the bottom face thereof. Since other constructions are same as those in the above-described second preferred embodiment, 300 is added to each of the reference numbers of corresponding portions in the second preferred embodiment to be shown in the figures, and the description thereof is omitted. In this modified example, it is possible to produce a metal/ceramic bonding substrate which has excellent radiating performance and which has a small amount of warpage and a small variation in warpage.

Figure 13A:
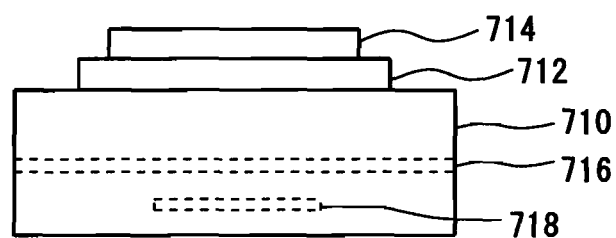
FIG. 13A is a side view showing a fourth modified example of the second preferred embodiment of the metal/ceramic bonding substrate according to the present invention.
Figure 13B:
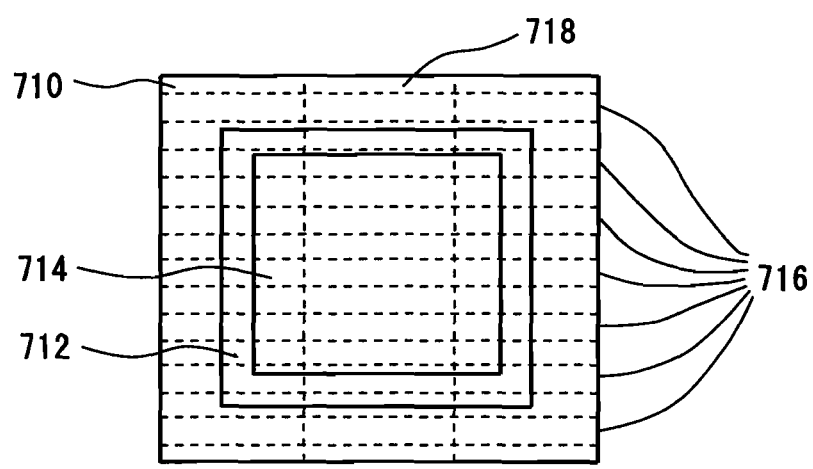
FIG. 13B is a plan view of the metal/ceramic bonding substrate of FIG. 13A.
Figure 14:
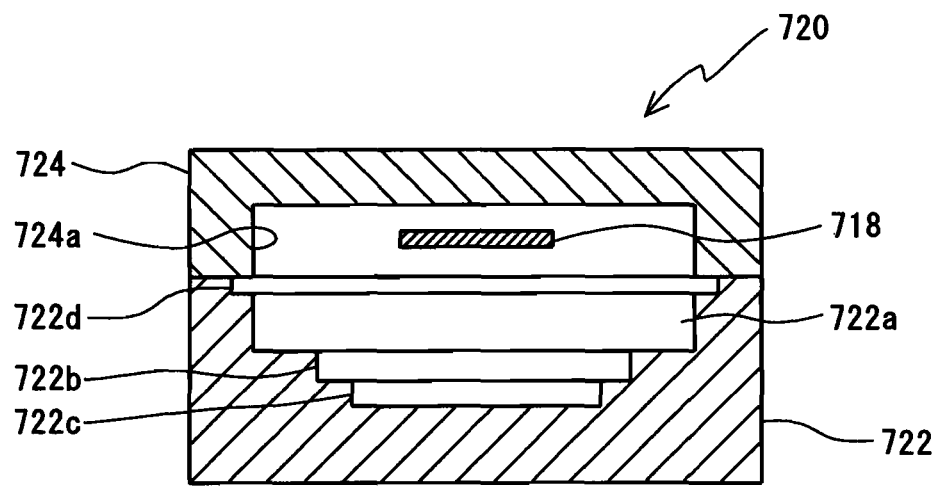
FIG. 14 is a schematic sectional view of a mold used for producing the metal/ceramic bonding substrate shown in FIGS. 13A and 13B.

FIGS. 13A, 13B and 14 show a fourth modified example of a metal/ceramic bonding substrate in this preferred embodiment and a mold used for producing the same.

In this modified example, a single reinforcing plate member 718, which is shorter than the length of the bottom face of a metal base plate 710 and which has the same width as that of the bottom face thereof, is arranged in the metal base plate 710 so as to be spaced from reinforcing members 716 toward the bottom face of the metal base plate 710 in the thickness directions thereof while extending over the whole width of the metal base plate 710 in directions substantially perpendicular to the reinforcing members 716. Since other constructions are same as those in the above-described second preferred embodiment, 400 is added to each of the reference numbers of corresponding portions in the second preferred embodiment to be shown in the figures, and the description thereof is omitted. In this modified example, it is possible to produce a metal/ceramic bonding substrate which has excellent radiating performance and which has a small amount of warpage and a small variation in warpage.

Figure 15A:
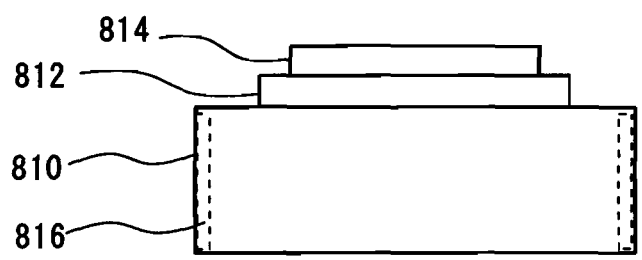
FIG. 15A is a side view showing a fifth modified example of the second preferred embodiment of the metal/ceramic bonding substrate according to the present invention.
Figure 15B:
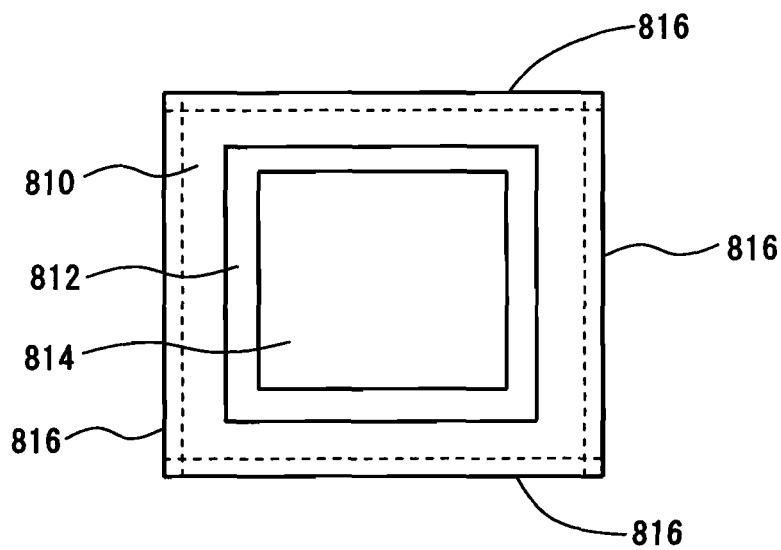
FIG. 15B is a plan view of the metal/ceramic bonding substrate of FIG. 15A.
Figure 16:
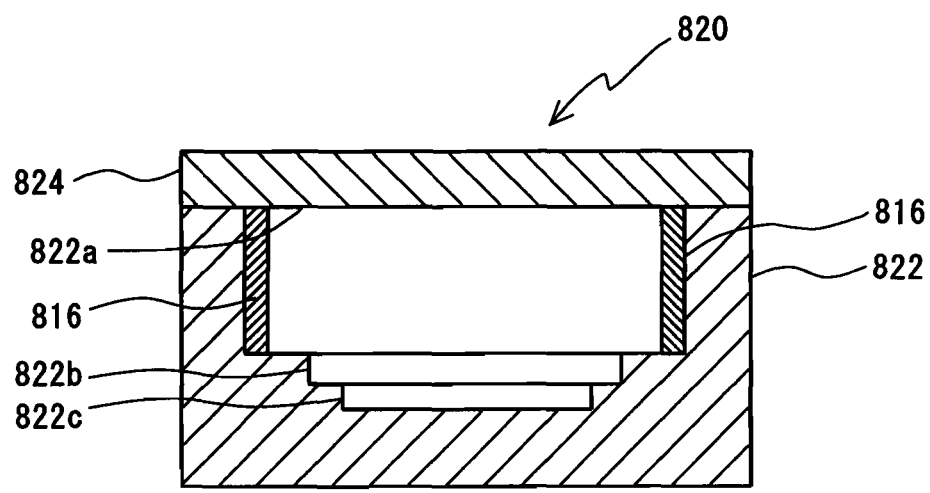
FIG. 16 is a sectional view of a mold used for producing the metal/ceramic bonding substrate shown in FIGS. 15A and 15B.

FIGS. 15A, 15B and 16 show a fifth modified example of a metal/ceramic bonding substrate in this preferred embodiment and a mold used for producing the same.

In this modified example, reinforcing plate members 816 are arranged so as to cover the side faces of a metal base plate 810. Since other constructions are same as those in the above-described second preferred embodiment, 500 is added to each of the reference numbers of corresponding portions in the second preferred embodiment to be shown in the figures, and the description thereof is omitted. In this modified example, it is possible to produce a metal/ceramic bonding substrate which has excellent radiating performance and which has a small amount of warpage and a small variation in warpage.

Figure 17A:
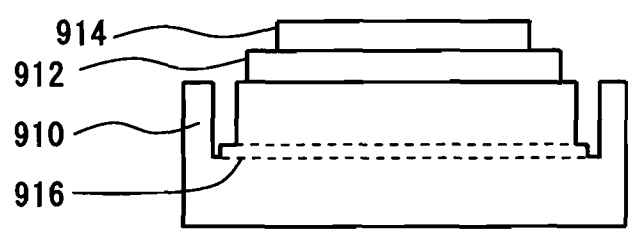
FIG. 17A is a side view showing a sixth modified example of the second preferred embodiment of the metal/ceramic bonding substrate according to the present invention.
Figure 17B:
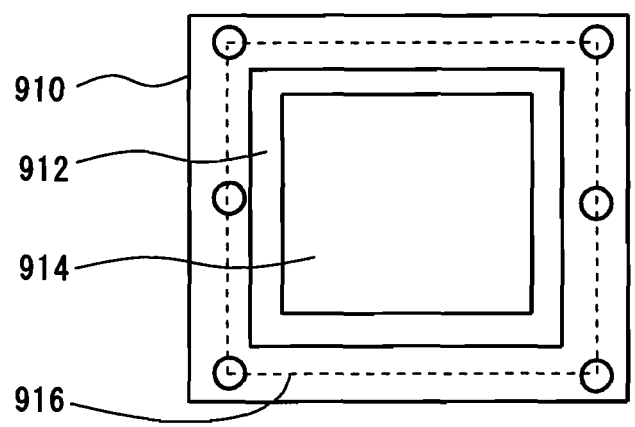
FIG. 17B is a plan view of the metal/ceramic bonding substrate of FIG. 17A.
Figure 18:
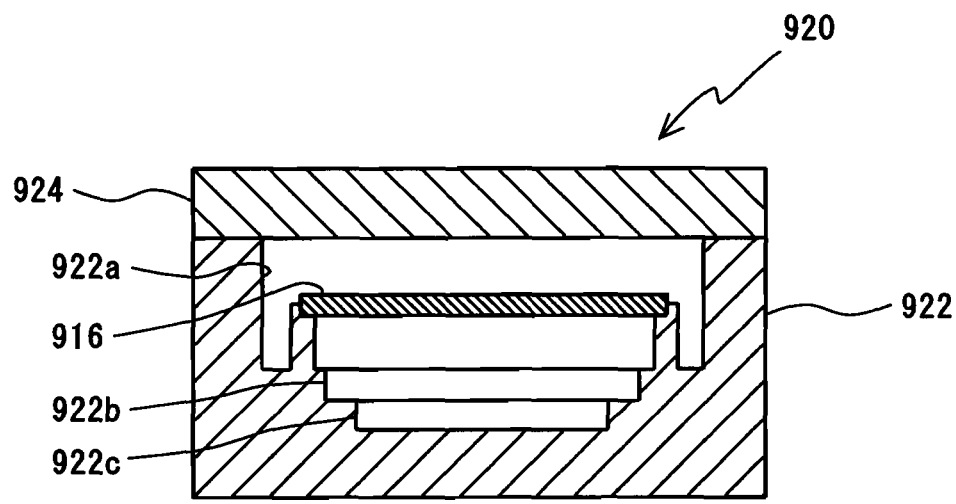
FIG. 18 is a sectional view of a mold used for producing the metal/ceramic bonding substrate shown in FIGS. 17A and 17B.

FIGS. 17A, 17B and 18 show a sixth modified example of a metal/ceramic bonding substrate in this preferred embodiment and a mold used for producing the same.

In this modified example, a single reinforcing plate member 916, which has a substantially rectangular planar shape and which is smaller than the major face of a metal base plate 910, is arranged in the substantially central portion of the metal base plate 910 in thickness directions to extend in substantially parallel to the major face of the metal base plate 910. Since other constructions are same as those in the above-described second preferred embodiment, 600 is added to each of the reference numbers of corresponding portions in the second preferred embodiment to be shown in the figures, and the description thereof is omitted. In this modified example, it is possible to produce a metal/ceramic bonding substrate which has excellent radiating performance and which has a small amount of warpage and a small variation in warpage.

Examples of the second preferred embodiment of a metal/ceramic bonding substrate and a method for producing the same according to the present invention will be described below in detail.

EXAMPLE 4

First, there was prepared a mold of carbon having a similar shape to that of the mold 320 shown in FIG. 6. There were also prepared a ceramic substrate 312 of AlN having a size of 50 mm×50 mm×0.6 mm, and seven reinforcing members 316 of AlN having a size of 80 mm×5 mm×0.6 mm. Then, the ceramic substrate 312 was arranged in the ceramic substrate housing portion 322b of the lower mold member 322 of the mold 320, and both end portions (portions having a length of 5 mm) of each of the reinforcing members 316 were arranged in the reinforcing member supporting portions 322d of the lower mold member 322, respectively. Thereafter, the lower mold member 322 was covered with the upper mold member 324 of the mold 320 to be put in a furnace, and the interior of the furnace was caused to be in an atmosphere of nitrogen to decrease the oxygen concentration therein to 4 ppm or less. In this state, the mold 320 was heated to 730° C. by the temperature control of a heater, and then, a molten metal of aluminum, which was heated to 740° C. and previously measured, was poured into the mold 320 from an injecting nozzle mounted on the inlet of the mold 320 while being pressurized at 10 kPa by nitrogen gas. Thus, the molten metal was filled in the metal base plate forming portion 322a having a size of 70 mm×70 mm×5 mm in the mold 320, and in the metal plate forming portion 322c having a size of 48 mm×48 mm×0.6 mm via the molten metal passage formed in the lower mold member 322. Thereafter, nitrogen gas was blown into the inlet from the injecting nozzle to cool and solidify the molten metal in the mold 320 while pressurizing the molten metal at 10 kPa. Thus, by a so-called molten metal bonding method, there was produced a metal/ceramic bonding substrate wherein the metal base plate 310 having a size of 70 mm×70 mm×5 mm was bonded directly to one side of each of the ceramic substrates 312 having a size of 50 mm×50 mm×0.6 mm, wherein seven reinforcing members 316 having a size of 80 mm×5 mm×0.6 mm passed through the metal base plate 310, both end portions (portions having a length of 5 mm) of each of the reinforcing members 316 in longitudinal directions protruding from the side faces of the metal base plate 310 and wherein the metal plate 314 for a circuit pattern having a size of 48 mm×48 mm×0.6 mm was bonded directly to the other side of each of the ceramic substrates 312. After the metal/ceramic bonding substrate was ejected from the mold 320, the both end portions of each of the reinforcing members 316 in longitudinal directions, the end portions protruding from the metal base plate 310, were cut to be removed, so that there was produced a metal/ceramic bonding substrate having a similar shape to that shown in FIGS. 5A and 5B.

With respect to the metal/ceramic bonding substrate thus obtained, the amount of warpage at the central portion on the surface of the metal plate 314 for a circuit pattern in longitudinal directions and lateral directions (perpendicular to the longitudinal directions) of the ceramic substrate 312 was measured at a span of 45 mm by a laser displacement meter, assuming that the amount of warpage was positive (+) when the surface of the metal plate 314 warps downwardly (concavely) and negative (−) when the surface of the metal plate 314 warps upwardly (convexly). While the ceramic substrate having a square planar shape has been used in Examples 5 through 17 and Comparative Examples 2 and 3 in addition to this example, it is assumed for convenience that the directions along one side of the square are longitudinal directions and that the directions perpendicular to the longitudinal directions are lateral directions. As a result, the amount of warpage in the longitudinal directions of the ceramic substrate 312 was −36 μm, and the amount of warpage in the lateral directions of the ceramic substrate 312 was −198 μm.

After a furnace passing treatment for holding the obtained metal/ceramic bonding substrate at 410° C. for 10 minutes in a furnace was carried out once, three times, five times and ten times, the amount of warpage of the metal/ceramic bonding substrate was measured. As a result, after the furnace passing treatment was carried out once, the amount of warpage in the longitudinal directions was −33 μm, and the amount of warpage in the lateral directions was −264 μm. After the furnace passing treatment was carried out three times, the amount of warpage in the longitudinal directions was −57 μm, and the amount of warpage in the lateral directions was −309 μm. After the furnace passing treatment was carried out five times, the amount of warpage in the longitudinal directions was −69 μm, and the amount of warpage in the lateral directions was −342 μm. After the furnace passing treatment was carried out ten times, the amount of warpage in the longitudinal directions was −90 μm, and the amount of warpage in the lateral directions was −390 μm.

After the furnace passing treatment was carried out ten times, the ceramic substrate 312 has no deficiencies such as cracks, and the electrical performance such as insulating performance of the metal/ceramic bonding substrate was good. The bonding of the metal plate 314 to the ceramic substrate 312, the bonding of the metal base plate 310 to the substrate 312, and the bonding of the metal base plate 310 to the reinforcing members 316 were good without causing any deficiencies.

EXAMPLE 5

There was produced a metal/ceramic bonding substrate by the same method as that in Example 4, except that there were used a single reinforcing member 316 having a size of 80 mm×50 mm×0.6 mm and a mold 320 corresponding thereto.

With respect to the metal/ceramic bonding substrate thus obtained, the amount of warpage at the central portion on the surface of the metal plate 314 was measured by the same method as that in Example 4. As a result, the amount of warpage in the longitudinal directions of the ceramic substrate 312 was −36 μm, and the amount of warpage in the lateral directions of the ceramic substrate 312 was −45 μm.

After a furnace passing treatment for holding the obtained metal/ceramic bonding substrate at 410° C. for 10 minutes in a furnace was carried out once, three times, five times and ten times, the amount of warpage of the metal/ceramic bonding substrate was measured. As a result, after the furnace passing treatment was carried out once, the amount of warpage in the longitudinal directions was −42 μm, and the amount of warpage in the lateral directions was −42 μm. After the furnace passing treatment was carried out three times, the amount of warpage in the longitudinal directions was −18 μm, and the amount of warpage in the lateral directions was −18 μm. After the furnace passing treatment was carried out five times, the amount of warpage in the longitudinal directions was −30 μm, and the amount of warpage in the lateral directions was −27 μm. After the furnace passing treatment was carried out ten times, the amount of warpage in the longitudinal directions was −63 μm, and the amount of warpage in the lateral directions was −63 μm.

COMPARATIVE EXAMPLE 2

Figure 19A:
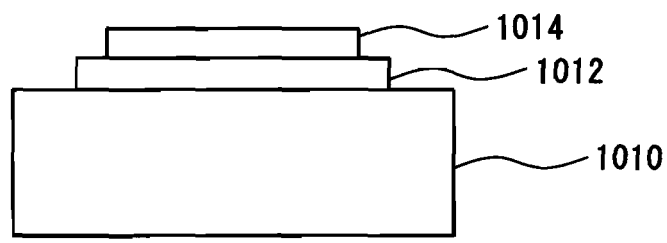
FIG. 19A is a side view showing a metal/ceramic bonding substrate produced as a comparative example 2 to the second preferred embodiment.
Figure 19B:
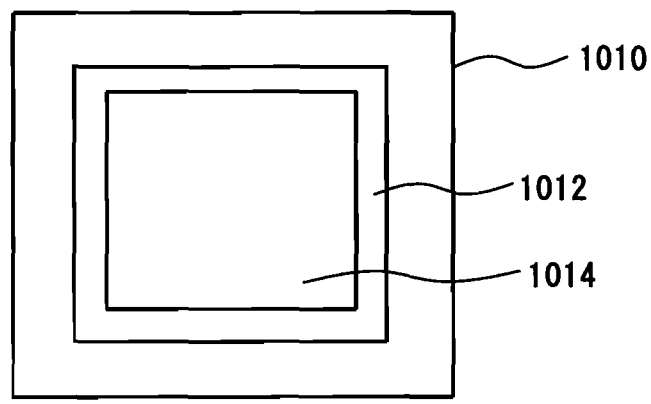
FIG. 19B is a plan view of the metal/ceramic bonding substrate of FIG. 19A.
Figure 20:
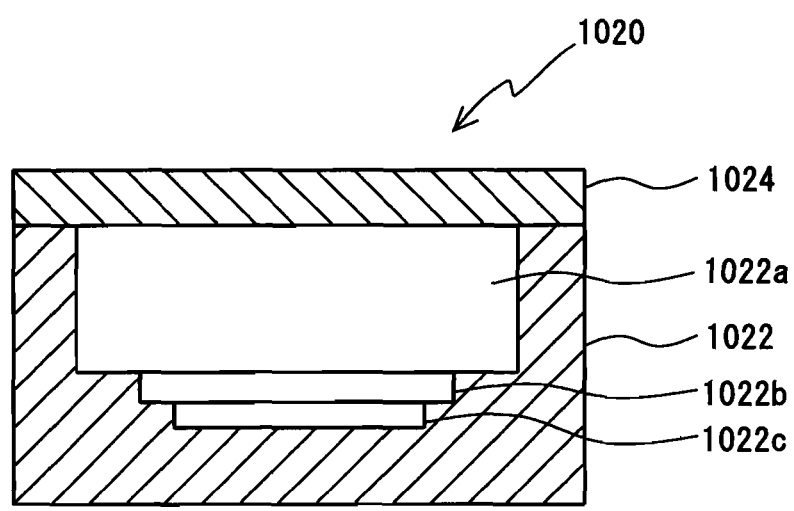
FIG. 20 is a sectional view of a mold used for producing the metal/ceramic bonding substrate shown in FIGS. 19A and 19B.

There was produced a metal/ceramic bonding substrate by the same method as that in Example 4, except that no reinforcing member 316 was used as shown in FIGS. 19A and 19B and that a mold 1020 corresponding thereto was used as shown in FIG. 20. Since other constructions of the metal/ceramic bonding substrate produced in this comparative example and the mold used for producing the same are same as those in the above-described second preferred embodiment, 700 is added to each of the reference numbers of corresponding portions in the second preferred embodiment to be shown in the figures, and the description thereof is omitted.

With respect to the metal/ceramic bonding substrate thus obtained, the amount of warpage at the central portion on the surface of the metal plate 1014 was measured by the same method as that in Example 4. As a result, the amount of warpage in the longitudinal directions of the ceramic substrate 1012 was −231 μm, and the amount of warpage in the lateral directions of the ceramic substrate 1012 was −201 μm.

After a furnace passing treatment for holding the obtained metal/ceramic bonding substrate at 410° C. for 10 minutes in a furnace was carried out once, three times, five times and ten times, the amount of warpage of the metal/ceramic bonding substrate was measured. As a result, after the furnace passing treatment was carried out once, the amount of warpage in the longitudinal directions was −273 μm, and the amount of warpage in the lateral directions was −252 μm. After the furnace passing treatment was carried out three times, the amount of warpage in the longitudinal directions was −321 μm, and the amount of warpage in the lateral directions was −294 μm. After the furnace passing treatment was carried out five times, the amount of warpage in the longitudinal directions was −351 μm, and the amount of warpage in the lateral directions was −333 μm. After the furnace passing treatment was carried out ten times, the amount of warpage in the longitudinal directions was −399 μm, and the amount of warpage in the lateral directions was −393 μm.

EXAMPLE 6

With respect to another metal/ceramic bonding substrate produced by the same method as that in Example 4, the amount of warpage at the central portion on the surface of a metal plate 314 for a circuit pattern was measured by the same method as that in Example 4. As a result, the amount of warpage in the longitudinal directions of a ceramic substrate 312 was −46 μm, and the amount of warpage in the lateral directions of the ceramic substrate 312 was −201 μm.

With respect to the obtained metal/ceramic bonding substrate, the amount of warpage at the central portion on the surface of the metal base plate 310 in longitudinal directions and lateral directions (perpendicular to the longitudinal directions) of the ceramic substrate 312 was measured at a span of 60 mm by a laser displacement meter, assuming that the amount of warpage was positive (+) when the surface of the metal plate 314 warps downwardly (concavely) and negative (−) when the surface of the metal plate 314 warps upwardly (convexly). As a result, the amount of warpage in the longitudinal directions of the ceramic substrate 312 was −84 μm, and the amount of warpage in the lateral directions of the ceramic substrate 312 was −336 μm.

EXAMPLE 7

With respect to another metal/ceramic bonding substrate produced by the same method as that in Example 6, the amount of warpage at the central portion on the surface of a metal plate 314 for a circuit pattern was measured by the same method as that in Example 4. As a result, the amount of warpage in the longitudinal directions of a ceramic substrate 312 was −27 μm, and the amount of warpage in the lateral directions of the ceramic substrate 312 was −45 μm.

With respect to the obtained metal/ceramic bonding substrate, the amount of warpage at the central portion on the surface of the metal base plate 310 in longitudinal directions and lateral directions (perpendicular to the longitudinal directions) of the ceramic substrate 312 was measured by the same method as in Example 6. As a result, the amount of warpage in the longitudinal directions of the ceramic substrate 312 was −33 µm, and the amount of warpage in the lateral directions of the ceramic substrate 312 was −78 µm.

EXAMPLE 8

There was produced a metal/ceramic bonding substrate by the same method as that in Example 4, except that there were used a single reinforcing member 316 having a size of 80 mm×60 mm×0.6 mm and a mold 320 corresponding thereto.

With respect to the metal/ceramic bonding substrate thus obtained, the amount of warpage at the central portion on the surface of the metal plate 314 for a circuit pattern was measured by the same method as that in Example 4. As a result, the amount of warpage in the longitudinal directions of the ceramic substrate 312 was −21 µm, and the amount of warpage in the lateral directions of the ceramic substrate 312 was −21 µm.

With respect to the obtained metal/ceramic bonding substrate, the amount of warpage at the central portion on the surface of the metal base plate 310 in longitudinal directions and lateral directions (perpendicular to the longitudinal directions) of the ceramic substrate 312 was measured by the same method as that in Example 6. As a result, the amount of warpage in the longitudinal directions of the ceramic substrate 312 was −30 µm, and the amount of warpage in the lateral directions of the ceramic substrate 312 was −39 µm.

EXAMPLE 9

There was produced a metal/ceramic bonding substrate having a similar shape to that of the metal/ceramic bonding substrate shown in FIGS. 11A and 11B, by the same method as that in Example 4, except that there were used a mold of carbon having a similar shape to that of the mold 620 shown in FIG. 12 and a single reinforcing member 616 having a size of 80 mm×60 mm×0.6 mm.

With respect to the metal/ceramic bonding substrate thus obtained, the amount of warpage at the central portion on the surface of the metal plate 614 for a circuit pattern was measured by the same method as that in Example 4. As a result, the amount of warpage in the longitudinal directions of the ceramic substrate 612 was −45 µm, and the amount of warpage in the lateral directions of the ceramic substrate 612 was −15 µm.

With respect to the obtained metal/ceramic bonding substrate, the amount of warpage at the central portion on the surface of the metal base plate 610 in longitudinal directions and lateral directions (perpendicular to the longitudinal directions) of the ceramic substrate 612 was measured by the same method as that in Example 6. As a result, the amount of warpage in the longitudinal directions of the ceramic substrate 612 was −72 µm, and the amount of warpage in the lateral directions of the ceramic substrate 612 was −42 µm.

COMPARATIVE EXAMPLE 3

With respect to another metal/ceramic bonding substrate produced by the same method as that in Comparative Example 2, the amount of warpage at the central portion on the surface of a metal plate 1014 for a circuit pattern was measured by the same method as that in Example 4. As a result, the amount of warpage in the longitudinal directions of a ceramic substrate 1012 was −213 µm, and the amount of warpage in the lateral directions of the ceramic substrate 1012 was −177 µm.

With respect to the obtained metal/ceramic bonding substrate, the amount of warpage at the central portion on the surface of the metal base plate 1010 for a circuit pattern in longitudinal directions and lateral directions (perpendicular to the longitudinal directions) of the ceramic substrate 1012 was measured by the same method as that in Example 6. As a result, the amount of warpage in the longitudinal directions of the ceramic substrate 1012 was −387 µm, and the amount of warpage in the lateral directions of the ceramic substrate 1012 was −345 µm.

EXAMPLE 10

There was produced a metal/ceramic bonding substrate by the same method as that in Example 4, except that three reinforcing members 316 having a size of 80 mm×10 mm×0.6 mm were used for forming a metal plate 314 for a circuit pattern having a size of 48 mm×48 mm×0.4 mm and a metal base plate 310 having a size of 70 mm×70 mm×4 mm.

With respect to the metal/ceramic bonding substrate thus obtained, the amount of warpage at the central portion on the surface of the metal base plate 310 in longitudinal directions and lateral directions (perpendicular to the longitudinal directions) of the ceramic substrate 312 was measured by the same method as that in Example 6. As a result, the amount of warpage in the longitudinal directions of the ceramic substrate 312 was −30 µm, and the amount of warpage in the lateral directions of the ceramic substrate 312 was −30 µm.

EXAMPLE 11

There was produced a metal/ceramic bonding substrate by the same method as that in Example 4, except that three reinforcing members 316 having a size of 80 mm×3 mm×0.6 mm were used for forming a metal plate 314 for a circuit pattern having a size of 48 mm×48 mm×0.4 mm and a metal base plate 310 having a size of 70 mm×70 mm×4 mm.

With respect to the metal/ceramic bonding substrate thus obtained, the amount of warpage at the central portion on the surface of the metal base plate 310 in longitudinal directions and lateral directions (perpendicular to the longitudinal directions) of the ceramic substrate 312 was measured by the same method as that in Example 6. As a result, the amount of warpage in the longitudinal directions of the ceramic substrate 312 was −25 µm, and the amount of warpage in the lateral directions of the ceramic substrate 312 was −25 µm.

EXAMPLE 12

There was produced a metal/ceramic bonding substrate by the same method as that in Example 4, except that three reinforcing members 316 having a size of 80 mm×10 mm×0.6 mm were used for forming a metal plate 314 for a circuit pattern having a size of 48 mm×48 mm×0.4 mm and a metal base plate 310 having a size of 70 mm×70 mm×8 mm.

With respect to the metal/ceramic bonding substrate thus obtained, the amount of warpage at the central portion on the surface of the metal base plate 310 in longitudinal directions and lateral directions (perpendicular to the longitudinal directions) of the ceramic substrate 312 was measured by the same method as that in Example 6. As a result, the amount of warpage in the longitudinal directions of the ceramic substrate 312 was −35 µm, and the amount of warpage in the lateral directions of the ceramic substrate 312 was −35 µm.

EXAMPLE 13

There was produced a metal/ceramic bonding substrate having a similar shape to that of the metal/ceramic bonding substrate shown in FIGS. 7A and 7B, by the same method as that in Example 4, except that there were used a mold of carbon having a similar shape to that of the mold 420 shown in FIG. 8 and three reinforcing members 416 having a size of 80 mm×3 mm×0.6 mm for forming a metal plate 414 for a circuit pattern having a size of 48 mm×48 mm×0.4 mm and a metal base plate 410 having a size of 70 mm×70 mm×8 mm.

With respect to the metal/ceramic bonding substrate thus obtained, the amount of warpage at the central portion on the surface of the metal base plate 410 in longitudinal directions and lateral directions (perpendicular to the longitudinal directions) of the ceramic substrate 412 was measured by the same method as that in Example 6. As a result, the amount of warpage in the longitudinal directions of the ceramic substrate 412 was −38 µm, and the amount of warpage in the lateral directions of the ceramic substrate 412 was −38 µm.

EXAMPLE 14

There was produced a metal/ceramic bonding substrate having a similar shape to that of the metal/ceramic bonding substrate shown in FIGS. 9A and 9B, by the same method as that in Example 4, except that there were used a mold of carbon having a similar shape to that of the mold 520 shown in FIG. 10 and six reinforcing members 516 having a size of 80 mm×3 mm×0.6 mm for forming a metal plate 514 for a circuit pattern having a size of 48 mm×48 mm×0.4 mm and a metal base plate 510 having a size of 70 mm×70 mm×8 mm.

With respect to the metal/ceramic bonding substrate thus obtained, the amount of warpage at the central portion on the surface of the metal base plate 510 in longitudinal directions and lateral directions (perpendicular to the longitudinal directions) of the ceramic substrate 512 was measured by the same method as that in Example 6. As a result, the amount of warpage in the longitudinal directions of the ceramic substrate 512 was −36 µm, and the amount of warpage in the lateral directions of the ceramic substrate 512 was −38 µm.

EXAMPLE 15

There was produced a metal/ceramic bonding substrate having a similar shape to that of the metal/ceramic bonding substrate shown in FIGS. 11A and 11B, by the same method as that in Example 4, except that there were used a mold of carbon having a similar shape to that of the mold 620 shown in FIG. 12 and a single reinforcing member 616 having a size of 50 mm×80 mm×0.6 mm.

With respect to the metal/ceramic bonding substrate thus obtained, the amount of warpage at the central portion on the surface of the metal base plate 610 in longitudinal directions and lateral directions (perpendicular to the longitudinal directions) of the ceramic substrate 612 was measured by the same method as that in Example 6. As a result, the amount of warpage in the longitudinal directions of the ceramic substrate 612 was −25 µm, and the amount of warpage in the lateral directions of the ceramic substrate 612 was −35 µm.

EXAMPLE 16

There was produced a metal/ceramic bonding substrate having a similar shape to that of the metal/ceramic bonding substrate shown in FIGS. 13A and 13B, by the same method as that in Example 4, except that there were used a mold of carbon having a similar shape to that of the mold 720 shown in FIG. 14 and a single reinforcing member 718 having a size of 50 mm×80 mm×0.6 mm.

With respect to the metal/ceramic bonding substrate thus obtained, the amount of warpage at the central portion on the surface of the metal base plate 710 in longitudinal directions and lateral directions (perpendicular to the longitudinal directions) of the ceramic substrate 712 was measured by the same method as that in Example 6. As a result, the amount of warpage in the longitudinal directions of the ceramic substrate 712 was −32 µm, and the amount of warpage in the lateral directions of the ceramic substrate 712 was −22 µm.

EXAMPLE 17

There was produced a metal/ceramic bonding substrate having a similar shape to that of the metal/ceramic bonding substrate shown in FIGS. 15A and 15B, by the same method as that in Example 4, except that there were used a mold of carbon having a similar shape to that of the mold 820 shown in FIG. 16 and four reinforcing members 816 having a size of 80 mm×4 mm×0.6 mm.

With respect to the metal/ceramic bonding substrate thus obtained, the amount of warpage at the central portion on the surface of the metal base plate 810 in longitudinal directions and lateral directions (perpendicular to the longitudinal directions) of the ceramic substrate 812 was measured by the same method as that in Example 6. As a result, the amount of warpage in the longitudinal directions of the ceramic substrate 812 was −43 µm, and the amount of warpage in the lateral directions of the ceramic substrate 812 was −38 µm.

Furthermore, after the radiating performance in thickness directions of each of the metal/ceramic bonding substrates in Examples 4 and 14 was examined, the decreasing rate of heat discharge thereof was only 3% or less in comparison with that on the reverse face of the metal/ceramic bonding substrate in Comparative Example 2. Therefore, in these examples, it is possible to restrain the warpage of the metal/ceramic bonding substrate while the radiating performance thereof is hardly deteriorated.

[Third Preferred Embodiment]

It is considered that a base plate of aluminum or an aluminum alloy is formed so as to surround a metal plate of copper or the like, which has a higher thermal conductivity than that of aluminum and the aluminum alloy, when a metal/ceramic bonding substrate integrated with the base plate is produced by the molten metal bonding method.

However, when a base plate of aluminum was formed so as to surround a copper plate by the molten metal bonding method, it was found that there is the possibility that a rigid and fragile intermetallic compound or solid solution of Al and Cu may be formed to deteriorate the reliability of the metal/ceramic bonding substrate, such as the thermal shock resistance of the metal/ceramic bonding substrate and the bonding strength of the base plate to the ceramic substrate, and the thermal conductivity thereof. It was also found that there is the possibility that the base plate may be removed from the boundary face thereof to the ceramic substrate. Moreover, it was found that it is not possible to restrain the amount of diffusion of Al and Cu.

Therefore, the third preferred embodiment of a metal/ceramic bonding substrate according to the present invention is designed to prevent the formation of the intermetallic compound or solid solution of the metal and Al while preventing the diffusion of the metal and Al, even if a base plate of aluminum or an aluminum alloy is formed so as to surround a metal plate of a metal, which has a higher thermal conductivity than that of aluminum or the aluminum alloy, when a metal/ceramic bonding substrate integrated with the base plate is produced by the molten metal bonding method.

Figure 21A:
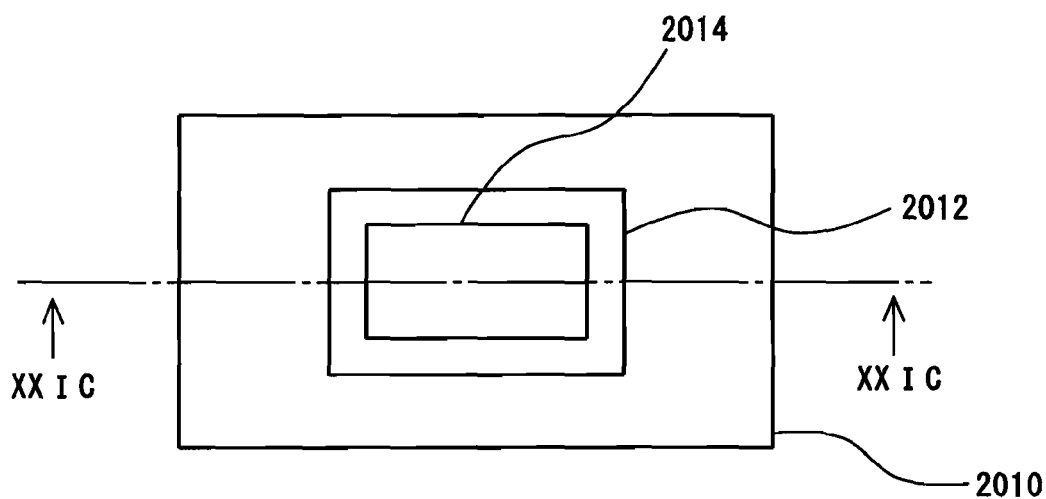
FIG. 21A is a plan view showing the third preferred embodiment of a metal/ceramic bonding substrate according to the present invention.
Figure 21B:
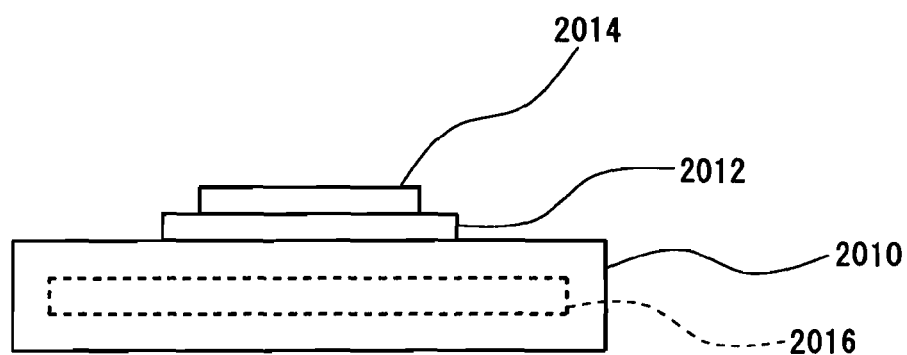
FIG. 21B is a side view of the metal/ceramic bonding substrate of FIG. 21A.
Figure 21C:
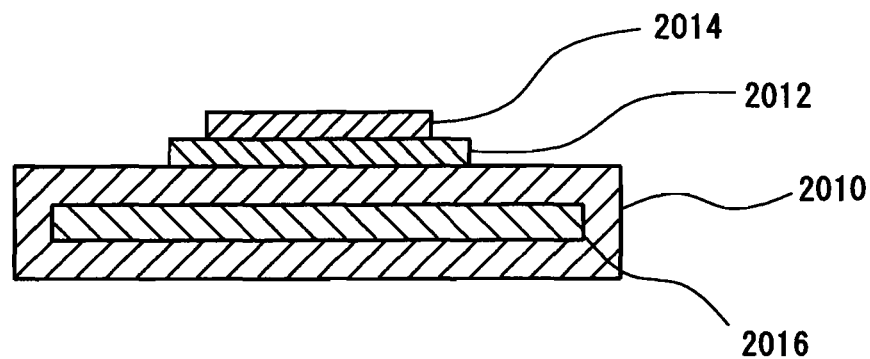
FIG. 21C is a sectional view of the metal/ceramic bonding substrate taken along line XXIC-XXIC in FIG. 21A.

As shown in FIGS. 21A through 21C, the third preferred embodiment of a metal/ceramic bonding substrate according to the present invention comprises: a base plate 2010 of aluminum or an aluminum alloy having a substantially rectangular planar shape; a ceramic substrate 2012 having a substantially rectangular planar shape, one side of the ceramic substrate 2012 being bonded directly to the base plate 2010; and a circuit pattern forming metal plate 2014 of aluminum or an aluminum alloy which is bonded directly to the other side of the ceramic substrate 2012. As shown in FIGS. 21B and 21C, a spray-coated member 2016, which is obtained by spray-coating the surface of a metal plate having a substantially rectangular planar shape, is arranged in the base plate 2010.

The metal plate of the spray-coated member 2016 is preferably made of a metal which has a higher thermal conductivity than that of aluminum or the aluminum alloy, and more preferably made of copper or a copper alloy. The thickness of the metal plate is preferably in the range of from about 0.3 mm to about 5 mm, and more preferably in the range of from about 0.5 mm to about 3 mm. When the spray-coated member 2016, which is obtained by spray-coating the surface of the metal plate having the higher thermal conductivity than that of aluminum or the aluminum alloy, is thus arranged in the base plate 2010, it is possible to prevent the formation of the intermetallic compound or solid solution of the metal and Al, and it is possible to prevent the diffusion of the metal and Al, in addition to such effects that the metal plate of the metal having the higher thermal conductivity than that of the of aluminum or the aluminum alloy is arranged in the base plate to improve radiating performance, such as transient and saturated heat characteristics. Thus, it is possible to prevent the deterioration in reliability of the metal/ceramic bonding substrate, such as the deterioration of the thermal shock resistance of the metal/ceramic bonding substrate and the bonding strength of the base plate to the ceramic substrate, and it is possible to prevent the deterioration in thermal conductivity of the metal/ceramic bonding substrate.

Figure 22:
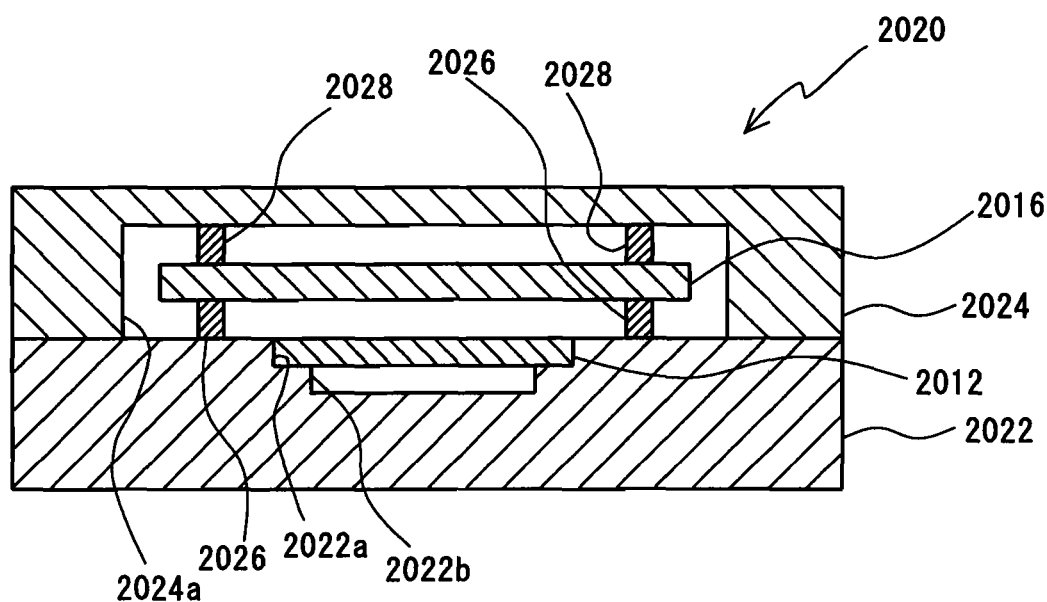
FIG. 22 is a sectional view of a mold used for producing the metal/ceramic bonding substrate shown in FIGS. 21A through 21C.

The metal/ceramic bonding substrate in the preferred embodiment shown in FIGS. 21A through 21C can be produced by a method comprising the steps of: spray-coating a ceramic on the surface of a metal plate to obtain the spray-coated member 2016 wherein the surface of the metal plate is coated with a spray-coating film; arranging the spray-coated member 2016 and the ceramic substrate 2012 at a predetermined interval in the mold 2020 shown in FIG. 22; injecting a molten metal into the mold 2020 so that the molten metal contacts the whole surface of the spray-coated member 2016 and both surfaces of the ceramic substrate 2012; and then, cooling the mold 2020.

The spray coating is preferably the plasma spray coating. The plasma spray coating is a method comprising the steps of: generating a direct-current arc between a cathode and the inner surface of an anode nozzle; heating and expanding a working medium which is supplied from the back by the direct-current arc; allowing a severe ultra-high temperature jet (plasma jet) to jet from the nozzle; causing a powder of a spray-coating material, which is supplied into the plasma jet by the working medium, to be heated and accelerated by the plasma jet to collide with the surface of a substrate to form a coating (sprayed coating) thereon. As the working medium, argon gas or nitrogen gas may be used. Hydrogen gas may be added thereto. A mixed gas of argon and helium may be used. The spray-coating material may be a ceramic powder, and is preferably a ceramic powder which is at least one selected from the group consisting of aluminum oxide ($Al_2O_3$), aluminum nitride (AlN), silicon carbide (SiC) and silicon nitride ($Si_3N_4$). In order to prevent the diffusion of Al and a metal such as Cu by the sprayed coating, the thickness of the sprayed coating is preferably in the range of from about 0.01 mm to about 0.3 mm, and more preferably in the range of from about 0.02 mm to about 0.2 mm.

As shown in FIG. 22, the mold 2020 of a permeable material, such as carbon or a porous material, comprises a lower mold member 2022 and an upper mold member 2024, each of which has a substantially rectangular planar shape. The top face of the lower mold member 2022 has a recessed portion (a ceramic substrate housing portion) 2022a for housing therein the ceramic substrate 2012. The bottom face of the recessed portion 2022a has a recessed portion (a circuit pattern forming aluminum plate forming portion) 2022b for forming an aluminum plate for a circuit pattern. The under surface (reverse face) of the upper mold member 2024 has a recessed portion (a base plate forming portion) 2024a for forming a base plate. The top face of the lower mold member 2022 has a plurality of retaining pins 2026 of the same material as that of the mold 2020 at positions around the ceramic substrate housing portion 2020a. The bottom face of the base plate forming portion 2024a of the upper mold member 2024 has a plurality of retaining pins 2028 of the same material as that of the mold 2020, the retaining pins 2028 being designed to face the retaining pins 2026 of the lower mold member 2022. When the lower mold member 2022 is covered with the upper mold member 2024 after the spray-coated member 2016 is put on the retaining pins 2026 of the lower mold member 2022, the spray-coated member 2016 is clamped by the retaining pins 2026 and the retaining pins 2028 at a substantially central portion of the base plate forming portion 2024a. The upper mold member 2024 has an inlet (not shown) for injecting a molten metal into the base plate forming portion 2024a from an injecting nozzle (not shown). The lower mold member 2022 has a molten metal passage (not shown) which extends between the base plate forming portion 2024a and the circuit pattern forming aluminum plate forming portion 2022b for establishing a communication between the base plate forming portion 2024a and the circuit pattern forming aluminum plate forming portion 2022b even if the ceramic substrate is housed in the ceramic substrate housing portion 2022a.

In order to use such a mold 2020 for producing the preferred embodiment of a metal/ceramic bonding substrate shown in FIGS. 21A and 21B, after the ceramic substrate 2012 is arranged in the ceramic substrate housing portion 2022a of the lower mold member 2022, the spray-coated member 2016 is put on the retaining pins 2026 of the lower mold member 2022, and then, the lower mold member 2022 is covered with the upper mold member 2024. In this state, if a molten metal of aluminum or an aluminum alloy is injected into the mold 2020 and cooled, it is possible to produce a metal/ceramic bonding substrate wherein the base plate 2010, which has the spray-coated member 2016 being arranged therein, is bonded directly to one side of the ceramic substrate 2012 and wherein the aluminum plate 2014 for a circuit pattern is bonded directly to the other side of the ceramic substrate 2012. Furthermore, although the base plate 2010 has a plurality of through holes corresponding to the retaining pins 2026 and 2028, these through holes are so small as to hardly have an influence on the reliability and thermal conductivity of the metal/ceramic bonding substrate.

Figure 23A:
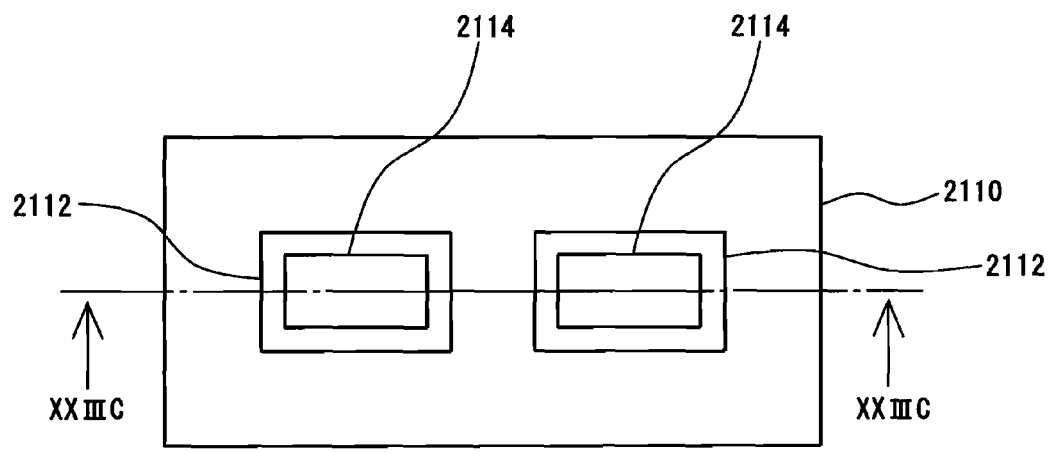
FIG. 23A is a plan view showing a modified example of the third preferred embodiment of a metal/ceramic bonding substrate according to the present invention.
Figure 23B:
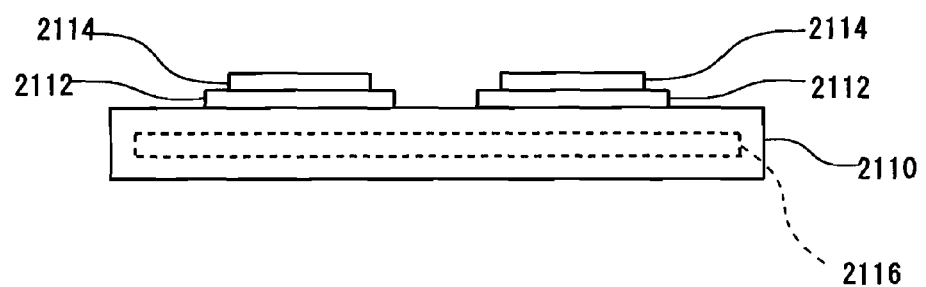
FIG. 23B is a sectional view of the metal/ceramic bonding substrate of FIG. 23A.
Figure 23C:
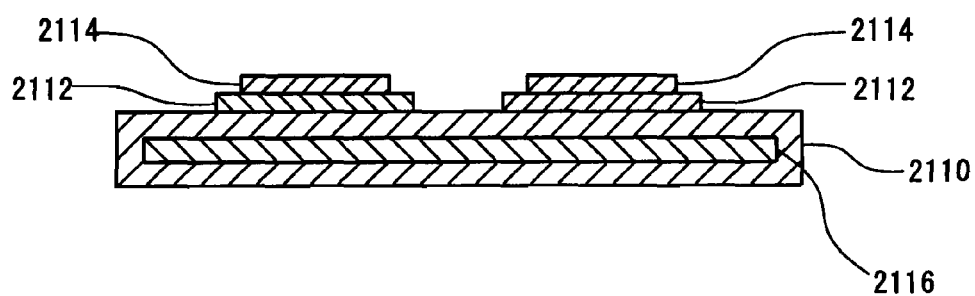
FIG. 23C is a sectional view of the metal/ceramic bonding substrate taken along line XXIIIC-XXIIIC in FIG. 23A.
Figure 24A:
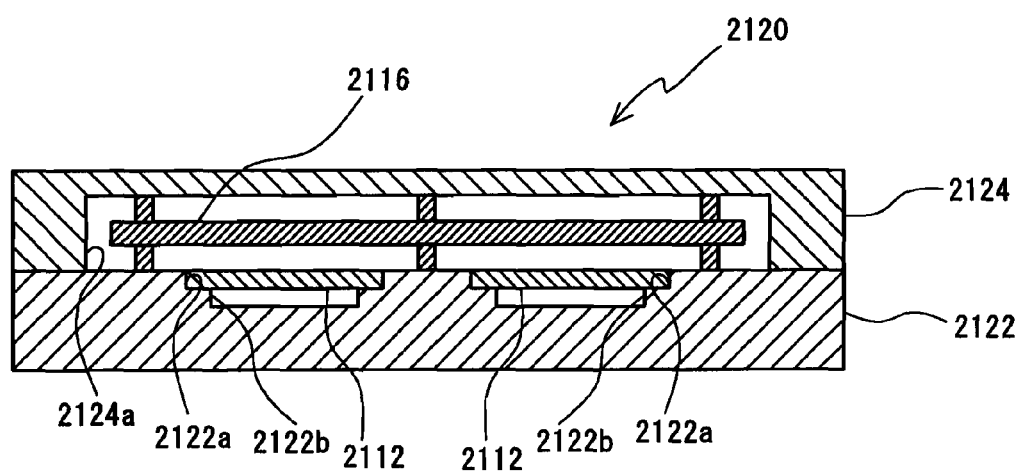
FIG. 24A is a sectional view of a mold used for producing the metal/ceramic bonding substrate shown in FIGS. 23A through 23C.
Figure 24B:
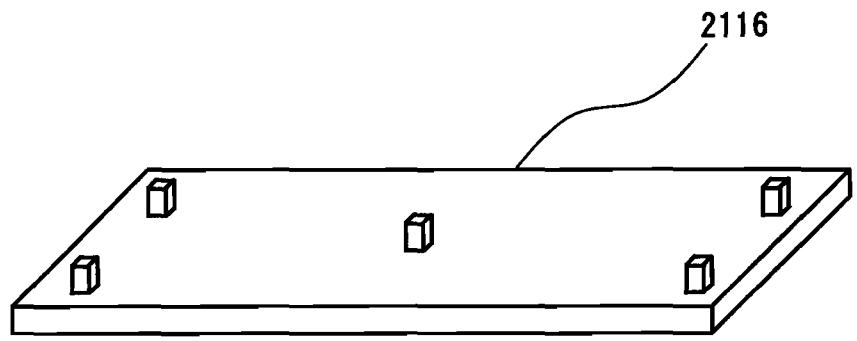
FIG. 24B is a perspective view of a spray-coated member arranged in the mold shown in FIG. 24A.

FIGS. 23A through 23C show a modified example of the third preferred embodiment of a metal/ceramic bonding substrate according to the present invention. FIG. 24A shows a mold used for producing the metal/ceramic bonding substrate in this modified example, and FIG. 24B shows a spray-coated member arranged in this mold. In this modified example, there are provided two ceramic substrates 2112 and two circuit pattern forming aluminum plates 2114. In addition, in place of the retaining pins 2026 and 2028, a plurality of protruding portions corresponding to these pins are formed on a metal member by press working or the like, and the surface of the metal member having the protruding portions is coated with a sprayed coating to form a spray-coated member 2116. Since other constructions of the metal/ceramic bonding substrate and a method for producing the same are substantially same as those in the above-described third preferred embodiment, 100 is added to each of the reference numbers of corresponding portions in the third preferred embodiment, and the description thereof is omitted. In this modified example, although a surface of each of the protruding portions of the spray-coated member 2016 is exposed to the outside from the surface of the base plate 2110, the area of each of the exposed surface is so small as to hardly have an influence on the reliability and thermal conductivity of the metal/ceramic bonding substrate.

Figure 25:
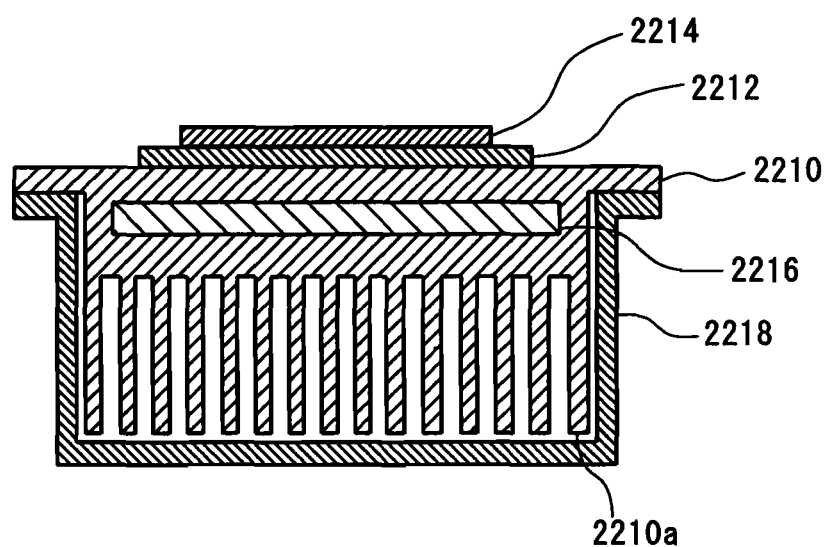
FIG. 25 is a sectional view showing another modified example of the third preferred embodiment of a metal/ceramic bonding substrate according to the present invention.
Figure 26:
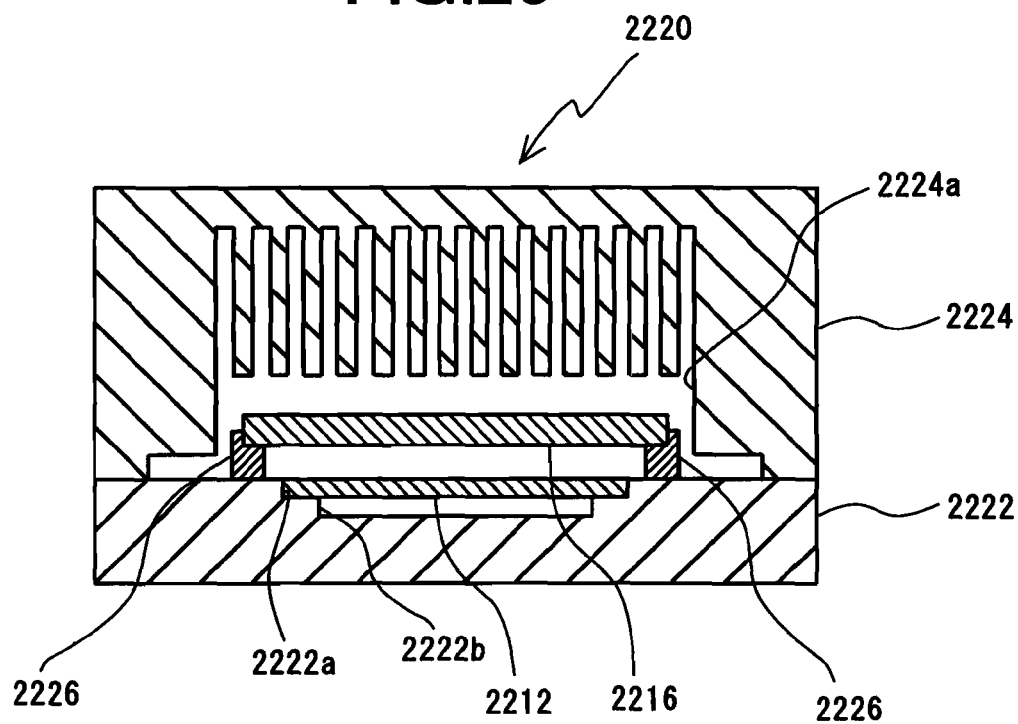
FIG. 26 is a sectional view of a mold used for producing the metal/ceramic bonding substrate shown in FIG. 25.

FIG. 25 shows another modified example of the third preferred embodiment of a metal/ceramic bonding substrate according to the present invention. FIG. 26 shows a mold used for producing the metal/ceramic bonding substrate in this modified example. In this modified example, retaining pins 2226 mounted on the top face of the lower mold member in place of the retaining pins 2026 and 2028 are designed to contact the bottom and side faces of a spray-coated member 2216 to retain the member 2216. In addition, a plurality of fins 2210a are formed on the bottom face of a base plate 2210 so as to extend in substantially parallel to each other while being spaced from each other at regular intervals. Since other constructions of the metal/ceramic bonding substrate and a method for producing the same are substantially same as those in the above-described third preferred embodiment, 200 is added to each of the reference numbers of corresponding portions in the third preferred embodiment, and the description thereof is omitted. Furthermore, as shown in FIG. 25, a water-coating jacket may be formed by covering the fins 2210a with a box-shaped member 2118, or an air-cooling jacket may be formed without providing the box-shaped member 2118. Although the base plate 2210 has a plurality of through holes corresponding to the retaining pins 2226, the through holes hardly have an influence on the reliability and thermal conductivity of the metal/ceramic bonding substrate since they are small.

As this modified example, similar fins to the plurality of (plate-shaped) fins 2210a, which are formed on the bottom face of the base plate 2210 so as to be spaced from each other at regular intervals and which extend in substantially parallel to each other, (or pin-shaped fins arranged so as to be spaced from each other at regular intervals) may be formed on the bottom face of the metal base plate of any one of the metal/ceramic bonding substrates in the above-described first and second preferred embodiments and the modified examples thereof, and the shape of a metal base forming portion of a mold for forming the one of the metal/ceramic bonding substrates may be modified so as to correspond thereto.

Examples of the preferred embodiment of a metal/ceramic bonding substrate and a method for producing the same according to the present invention will be described below in detail.

EXAMPLE 18

A film of $Al_2O_3$ having a thickness of 0.1 mm was formed on a Cu plate having a thickness of 1 mm by the plasma spray coating to form a spray-coated member. After the spray-coated member and an AlN substrate were housed in a mold which is similar to the mold 2020 shown in FIG. 22, the interior of the mold was heated in an atmosphere of nitrogen, and a molten metal of aluminum was injected into the mold while oxide films on the surface thereof were removed. Thereafter, the mold was cooled to solidify the molten metal to produce a metal/ceramic bonding substrate integrated with a base plate having a thickness of 5 mm and having the spray-coated member therein. After a cross section obtained by cutting the metal/ceramic bonding substrate was observed, the diffusion of Cu and Al was not observed, and no intermetallic compound was observed. In addition, bonding deficiencies, such as voids, were not observed on the bonded boundary surface of the AlN substrate to the base plate and on the bonded boundary surface of the spray-coated member to the base plate, so that it was found that the bonding strength was sufficiently strong.

EXAMPLE 19

A metal/ceramic bonding substrate integrated with a base plate was produced by the same method as that in Example 18, except that a Cu plate having a thickness of 3 mm was used. After a cross section obtained by cutting the metal/ceramic bonding substrate was observed, the diffusion of Cu and Al was not observed, and no intermetallic compound was observed. In addition, bonding deficiencies, such as voids, were not observed on the bonded boundary surface of the AlN substrate to the base plate and on the bonded boundary surface of the spray-coated member to the base plate, so that it was found that the bonding strength was sufficiently strong.

EXAMPLE 20

A metal/ceramic bonding substrate integrated with a base plate was produced by the same method as that in Example 19, except that a film of $Al_2O_3$ having a thickness of 0.02 mm was formed by the plasma spray coating. After a cross section obtained by cutting the metal/ceramic bonding substrate was observed, the diffusion of Cu and Al was not observed, and no intermetallic compound was observed. In addition, bonding deficiencies, such as voids, were not observed on the bonded boundary surface of the AlN substrate to the base plate and on the bonded boundary surface of the spray-coated member to the base plate, so that it was found that the bonding strength was sufficiently strong.

EXAMPLE 21

A metal/ceramic bonding substrate integrated with a base plate was produced by the same method as that in Example 19, except that a film of $Al_2O_3$ having a thickness of 0.05 mm was formed by the plasma spray coating. After a cross section obtained by cutting the metal/ceramic bonding substrate was observed, the diffusion of Cu and Al was not observed, and no intermetallic compound was observed. In addition, bonding deficiencies, such as voids, were not observed on the bonded boundary surface of the AlN substrate to the base plate and on the bonded boundary surface of the spray-coated member to the base plate, so that it was found that the bonding strength was sufficiently strong.

COMPARATIVE EXAMPLE 4

A metal/ceramic bonding substrate integrated with a base plate was produced by the same method as that in Example 18, except that the Cu plate was not spray-coated by the plasma spray coating. After a cross section obtained by cutting the metal/ceramic bonding substrate was observed, the mutual diffusion of Cu and Al was observed, and intermetallic compounds were observed.

The invention claimed is:

1. A metal/ceramic bonding substrate comprising:
    a ceramic substrate;
    a metal plate bonded directly to one side of the ceramic substrate;
    a metal base plate bonded directly to the other side of the ceramic substrate; and
    a reinforcing plate member arranged so as to extend from one of both end faces in the directions of one of longitudinal and lateral directions of the metal base plate to the other end face thereof without interrupting that the metal base plate extends between a bonded surface of the metal base plate to the ceramic substrate and the opposite surface thereof, the reinforcing plate member extending in parallel to the bonded surface, both end faces in longitudinal directions of the reinforcing plate member being exposed to the outside, the whole surface of the reinforcing plate member except for the both end faces thereof being bonded directly to the metal base plate.

2. A metal/ceramic bonding substrate as set forth in claim 1, wherein said metal base plate has a portion extending in directions perpendicular to said bonded surface.

3. A metal/ceramic bonding substrate as set forth in claim 1, wherein said reinforcing plate member has a surface which extends in parallel to said bonded surface and which has a portion facing said ceramic substrate, the portion of the surface of said reinforcing plate member having a smaller area than that of said bonded surface.

4. A metal/ceramic bonding substrate as set forth in claim 1, wherein said reinforcing plate member comprises a plurality of plate or rod members which are arranged on a plane extending in parallel to said bonded surface and which are spaced from each other at predetermined intervals to extend in parallel to each other.

5. A metal/ceramic bonding substrate as set forth in claim 1, wherein said reinforcing plate member is a lattice-shaped plate member comprising a plurality of longitudinal plate portions, which are arranged on a plane extending in parallel to said bonded surface and which are spaced from each other at predetermined intervals to extend in longitudinal directions of said metal base plate, and a plurality of lateral plate portions which are spaced from each other at predetermined intervals to extend in lateral directions of said metal base plate to connect the longitudinal plate portions to each other.

6. A metal/ceramic bonding substrate as set forth in claim 1, wherein said reinforcing plate member is made of a steel or a metal which contains iron and at least one selected from the group consisting of nickel, cobalt, copper and manganese.

7. A metal/ceramic bonding substrate as set forth in claim 1, wherein said reinforcing plate member is made of at least one ceramic selected from the group consisting of alumina, aluminum nitride, silicon nitride and silicon carbide.

8. A metal/ceramic bonding substrate as set forth in claim 1, wherein said metal base plate is made of aluminum or an aluminum alloy.

9. A metal/ceramic bonding substrate as set forth in claim 1, wherein said metal plate is made of aluminum or an aluminum alloy.

10. A metal/ceramic bonding substrate as set forth in claim 1, wherein said ceramic substrate is made of at least one ceramic selected from the group consisting of alumina, aluminum nitride, silicon nitride and silicon carbide.

* * * * *